(12) United States Patent
McKone et al.

(10) Patent No.: US 10,263,308 B2
(45) Date of Patent: Apr. 16, 2019

(54) SOLAR FLOW BATTERY

(71) Applicant: CORNELL UNIVERSITY, Ithaca, NY (US)

(72) Inventors: James R. McKone, Ithaca, NY (US); Hector D. Abruna, Ithaca, NY (US)

(73) Assignee: CORNELL UNIVERSITY, Ithaca, NY (US)

(*) Notice: Subject to any disclaimer, the term of this patent is extended or adjusted under 35 U.S.C. 154(b) by 155 days.

(21) Appl. No.: 15/128,321

(22) PCT Filed: Mar. 23, 2015

(86) PCT No.: PCT/US2015/021964
§ 371 (c)(1),
(2) Date: Sep. 22, 2016

(87) PCT Pub. No.: WO2015/148358
PCT Pub. Date: Oct. 1, 2015

(65) Prior Publication Data
US 2017/0179558 A1  Jun. 22, 2017

Related U.S. Application Data

(60) Provisional application No. 61/969,553, filed on Mar. 24, 2014, provisional application No. 62/039,086, filed on Aug. 19, 2014.

(51) Int. Cl.
*H02J 7/35* (2006.01)
*H01M 14/00* (2006.01)
(Continued)

(52) U.S. Cl.
CPC ........ *H01M 14/005* (2013.01); *H01L 31/053* (2014.12); *H01M 8/188* (2013.01); *H02J 7/355* (2013.01); *Y02E 60/528* (2013.01)

(58) Field of Classification Search
CPC ...................................................... H02J 7/355
(Continued)

(56) References Cited

U.S. PATENT DOCUMENTS 4,021,323 A  5/1977 Kilby et al.
4,064,326 A  12/1977 Manassen et al.
(Continued)

FOREIGN PATENT DOCUMENTS

WO  WO 2011/131959 A1  10/2011
WO  WO 2014/011753 A2  1/2014

OTHER PUBLICATIONS

International Search Report dated Jul. 2, 2015 issued in PCT/US2015/021963.
(Continued)

*Primary Examiner* — Suchin Parihar
(74) *Attorney, Agent, or Firm* — Scully Scott Murphy & Presser

(57) ABSTRACT

A solar flow battery comprising: a positive compartment containing at least one positive electrode in contact with a positive electrolyte containing a first redox active molecule; a negative compartment containing at least one negative electrode in contact with a negative electrolyte containing a second redox active molecule, wherein said first and second redox active molecules remain dissolved in solution when changed in oxidation state; at least one of said negative or positive electrodes comprises a semiconductor light absorber; electrical communication means between said electrodes and an external load for directing electrical energy into or out of said solar flow battery; a separator component that separates the positive and negative electrolytes while permitting the passage of non-redox-active species; and means for establishing flow of the positive and negative electrolyte solutions past respective electrodes. Methods of using the solar flow battery for storing and releasing electrical energy are also described.

44 Claims, 10 Drawing Sheets

(51) Int. Cl.
*H01M 8/18* (2006.01)
*H01L 31/053* (2014.01)

(58) Field of Classification Search
USPC .......................................................... 320/101
See application file for complete search history.

(56) References Cited

U.S. PATENT DOCUMENTS

| | | |
|---|---|---|
| 4,136,436 A | 1/1979 | Kilby et al. |
| 4,259,418 A | 3/1981 | Clark et al. |
| 4,421,835 A | 12/1983 | Manassen et al. |
| 5,817,842 A | 10/1998 | Clerici et al. |
| 8,753,761 B2 | 6/2014 | Esswein et al. |
| 8,816,465 B1 * | 8/2014 | Gardner ................ H01L 31/053 257/461 |
| 2003/0068561 A1 | 4/2003 | Okahara et al. |
| 2004/0234843 A1 * | 11/2004 | Skyllas-Kazacos ......................... B60L 11/1879 429/105 |
| 2005/0244707 A1 | 11/2005 | Skyllas-Kazacos et al. |
| 2008/0081247 A1 | 4/2008 | Nakaishi et al. |
| 2009/0023804 A1 | 1/2009 | Baugh et al. |
| 2010/0047671 A1 | 2/2010 | Chiang et al. |
| 2011/0045332 A1 | 2/2011 | Horne et al. |
| 2012/0028137 A1 | 2/2012 | Chase et al. |
| 2012/0135278 A1 | 5/2012 | Yoshie et al. |
| 2013/0022846 A1 * | 1/2013 | Liu ........................ H01M 8/188 429/81 |
| 2013/0157162 A1 | 6/2013 | Dong et al. |
| 2013/0224550 A1 | 8/2013 | Bugga et al. |
| 2013/0266836 A1 | 10/2013 | Wang et al. |
| 2014/0370403 A1 | 12/2014 | Narayan et al. |
| 2015/0207165 A1 * | 7/2015 | Schubert ................ H01M 8/188 429/50 |
| 2016/0118515 A1 * | 4/2016 | Mori ............... H01L 31/022441 136/256 |
| 2017/0187059 A1 * | 6/2017 | Potash .................. H01M 8/188 |

OTHER PUBLICATIONS

Yan, N.F. et al., "Solar rechargeable redox flow battery based on $Li_2WO_4/LiI$ couples in dual-phase electrolytes", J. Mater. Chem. A, (2013), vol. 1, 4 pages.

International Search Report dated Jun. 20, 2015 issued in PCT/US2015/021964.

Leung, P. et al., "Progress in redox flow batteries, remaining challenges and their applications in energy storage", RSC Advances, (2012), vol. 2, pp. 10125-10156.

Sharon, M. et al., "Solar Rechargeable Battery—Principle and Materials", Electrochimica Acta, (1991), vol. 36, No. 7, pp. 1107-1126.

* cited by examiner

SOLAR FLOW BATTERY

CROSS-REFERENCE TO RELATED APPLICATIONS

This application claims priority from U.S. Provisional Application No. 61/969,553, filed Mar. 24, 2014, and U.S. Provisional Application No. 62/039,086, filed Aug. 19, 2014, both of which are herein incorporated by reference in their entirety.

STATEMENT REGARDING FEDERALLY SPONSORED RESEARCH

This invention was made with government support under Contract Nos. DE-SC0001086 and DE-AC05-06OR23100 awarded by the Department of Energy. The government has certain rights in the invention.

BACKGROUND OF THE DISCLOSURE

Sustainable economic growth in the $21^{st}$ century would inevitably result in a massive expansion in the use of renewable energy technologies. Solar energy is, by far, the most plentiful renewable source of energy. It is generally known that more solar energy strikes the cross-section of the earth in one hour than humanity currently uses in one year. Therefore, research efforts in the renewable energy arena are expected to focus on direct capture and utilization of solar energy.

The spatial and temporal intermittency of solar energy requires the development of large-scale capture and storage technologies. Without storage, solar energy cannot replace fossil fuels as the dominant source of energy, especially in the transportation and industrial sectors. To this end, many researchers have focused efforts on developing new means of storing large quantities of solar energy. One approach involves biological engineering of photosynthetic organisms to provide advanced biofuels. Another involves continued development of inexpensive and efficient solar photovoltaics to couple to advanced secondary batteries such as sodium-sulfur and lithium ion cells. A third approach involves so-called "artificial photosynthesis," wherein a semiconductor or photocatalyst material is made to produce a chemical compound (fuel), such as hydrogen, which can be stored and transported as needed.

Regardless of the specific processes involved, an energy system based on sunlight input generally requires three components: the means to capture solar photons, a way to store the energy of those photons, and a method to release the stored energy for use on demand. Notably, fossil fuels also fit this descriptive model of solar energy storage and release. However, energy storage in fossil fuels proceeds over geological time scales. To date, the development of cost-competitive renewable alternatives to fossil fuels has been challenging. For all these reasons, improved methods for the efficient storage and release of solar energy would result in a significant advance for renewable energy usage.

BRIEF SUMMARY OF THE DISCLOSURE

In one aspect, the instant disclosure is directed to a redox flow battery (RFB) in which at least one of the electrodes is a semiconductor solar absorber. The aforesaid RFB design is conveniently referred to more particularly as a "solar flow battery" or SFB. More particularly, the redox flow battery disclosed herein includes: (i) a positive compartment containing at least one positive electrode in contact with a positive electrolyte solution comprised of a first redox active molecule dissolved in a solvent, wherein said first redox active molecule has a characteristic of remaining dissolved in solution when changed in oxidation state; (ii) a negative electrode compartment containing at least one negative electrode in contact with a negative electrolyte solution comprised of a second redox active molecule dissolved in a solvent, wherein said second redox active molecule has a characteristic of remaining dissolved in solution when changed in oxidation state; (iii) at least one of said negative or positive electrodes comprising a semiconductor light absorber; (iv) electrical communication means for establishing electrical communication between said positive electrode, said negative electrode, and an external load for directing electrical energy into or out of said solar flow battery; (v) a separator component that separates the positive electrolyte solution from the negative electrolyte solution and substantially prevents first and second redox active molecules from intermingling while permitting the passage of non-redox-active species between positive and negative electrolyte solutions; and (vi) means capable of establishing flow of the positive and negative electrolyte solutions past said positive and negative electrodes, respectively. The solar flow battery described herein advantageously captures and stores solar energy with high efficiency in the form of electrochemical energy. The stored electrochemical energy can be subsequently converted back to electrical energy and discharged as such.

In another aspect, the instant disclosure is directed to methods for storing and releasing electrical energy using the above-described solar flow battery. The method includes: (i) charging the solar flow battery by exposing the semiconductor light absorber to solar irradiation while the external load is not in electrical communication with the positive and negative electrodes, to result in oxidation of the first redox active molecule in the positive electrolyte and reduction of the second redox active molecule in the negative electrolyte, to produce, respectively, an oxidized version of the first redox active molecule in the positive electrolyte and a reduced version of the second redox active molecule in the negative electrolyte; and (ii) discharging the solar flow battery by establishing electrical communication of the external load with the positive and negative electrodes, to result in net electrical power output dissipated at the external load with concomitant reversal of redox reactions in the positive and negative electrolytes. In the charging step (i), the redox reactions in the positive and negative compartments proceed in a thermodynamically uphill direction, thereby storing electromagnetic energy as electrochemical energy; in the discharging step (ii), the redox reactions proceed in the thermodynamically downhill direction, thereby releasing the stored electrochemical energy as electrical energy.

DETAILED DESCRIPTION OF THE DISCLOSURE

Figure 1:
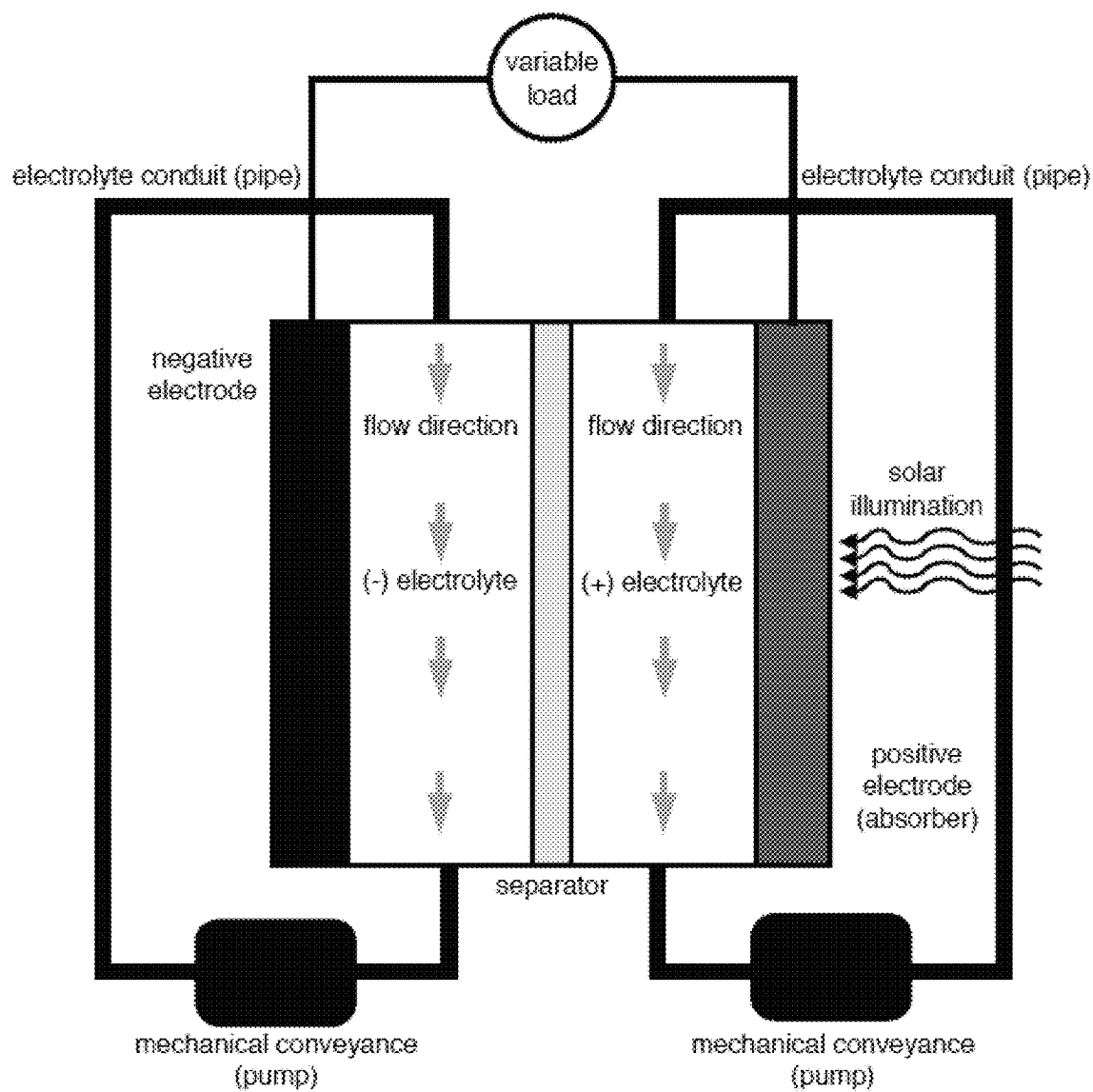
FIG. 1. A general schematic for the solar flow battery SFB process in which two electrodes are used is shown in FIG. 1. The figure depicts one electrode (at right) as a positive photoelectrode and the other electrode (at left) as a conventional negative electrode.

In a first aspect, the invention is directed to a solar flow battery (SFB), as generically described above. As in a conventional redox flow battery (RFB), the SFB contains a positive compartment and a negative compartment. The positive compartment (i.e., "cathode compartment") contains a positive electrolyte solution (i.e., "catholyte") in contact with a positive electrode (i.e., "cathode"), wherein the term "positive electrode" does not require that the electrode be in operation to possess a positive polarity, but rather, indicates an electrode suitable in its characteristics (i.e., "when not in operation") for oxidizing the redox active molecule during the charging phase and reducing the redox active molecule during the discharging phase. The negative compartment (i.e., "anode compartment") contains a negative electrolyte solution (i.e., "anolyte") in contact with a negative electrode (i.e., "anode"), wherein the term "negative electrode" does not require that the electrode be in operation to possess a negative polarity, but rather, indicates an electrode suitable in its characteristics (i.e., when not in operation) for reducing the redox active molecule during the charging phase and oxidizing the redox active molecule during the discharging phase. By the same reasoning, the term "positive" and "negative," when ascribed to an electrolyte solution or compartment, is intended to indicate an electrolyte in contact with the corresponding electrode, and a compartment used for holding the corresponding electrolyte or electrode. The positive and negative compartments can be constructed of any of the materials known in the art that are non-reactive and suitable for holding aqueous or non-aqueous (i.e., organic) liquid solutions. The positive and negative electrodes are independently constructed of any of the electrode materials known in the art, particularly those used in redox flow batteries of the art and suitable for the purposes of the invention described herein. The positive and negative electrodes may independently include or be selected from, for example, graphite, carbon felt, glassy carbon, nickel on carbon, porous nickel sulfide, nickel foam, platinum, palladium, gold, titanium, titanium oxide, ruthenium oxide, iridium oxide, or a composite, such as a carbon-polyolefin composite, or a composite containing polyvinylidene difluoride (PVdF) and activated carbon, or a composite of platinum and titanium, e.g., platinized titanium. In some embodiments, the electrode material may include or be composed of an element selected from C, Si, Ga, In, Al, Ti, V, Cr, Fe, Co, Ni, Cu, Zr, Nb, Ta, Mo, W, Re, Ru, Os, Rh, Ir, Pd, Pt, Ag, Au, alloys thereof, degenerately-doped semiconductors thereof, and oxides thereof. The choice of electrode material may be dependent on the choice of redox active molecule, solvent, and other aspects of the redox flow battery in particular embodiments. For this reason, any of the specific classes or types of electrode materials described above may be excluded or specifically selected in particular embodiments.

For purposes of the instant invention, at least one of the electrodes has a semiconductor light absorbing composition, i.e., is a "semiconductor light absorber," otherwise known as a "photoelectrode." As well known in the art, a photoelectrode possesses both a semiconducting property, thereby being able to conduct electrons, and a photovoltaic property, thereby being able to convert light energy into potential energy. Numerous types of photoelectrode materials are known in the art, any of which may be used in the instant invention. The photoelectrode material may be or include, for example, Si, $SiO_2$, Ti, $TiO_2$, Ge, GaN, GaAs, InP, GaP, $MoS_2$, $MoSe_2$, $WS_2$, $WSe_2$, $Cu(In,Ga)(S,Se)_2$, $Cu_2ZnSn(S,Se)_4$, CdS, CdSe, and CdTe, and mixtures thereof, wherein elements shown in parentheses may be included singly or together. The term "mixtures thereof" may indicate a chemical alloy, an intimate mixture of particles or grains of at least two of the foregoing compositions, or a composite containing separate bonded layers having discrete compositions. For use as a positive electrode, the photoelectrode may be referred to as a "photoanode", and for use as a negative electrode, the photoelectrode may be referred to as a "photocathode". The SFB may employ only a photoanode in combination with a conventional negative electrode, or a photocathode in combination with a conventional positive electrode, or both a photoanode and a photocathode with or without one or more conventional electrodes. The photoanode and photocathode may have the same or different compositions. In some embodiments, the photoanode and/or photocathode include suitable doping, such as n-type doping for the photoanode and p-type doping for the photocathode.

The SFB includes a separator component that separates the electrolyte solution in the positive compartment from the electrolyte solution in the negative compartment in order to substantially prevent the redox molecules in the positive and negative compartments from intermingling with each other. The separator component should, however, possess a feature that permits the passage of non-redox-active species between positive and negative electrolyte solutions. The non-redox-active species are those ionic species, as well known in the art, that establish electrical neutrality and complete the circuitry in a battery, and which are included as either a supporting electrolyte or are formed during the course of the redox reactions in each compartment. In order to permit flow of non-redox-active species, the separator component may be, to some extent, porous. Some examples of inorganic or ceramic compositions for the separator component include alumina, silica (e.g., glass), titania, and zirconia. Porous organic polymers that do not separate by ionic charge but rather, size exclusion, may also be used. These can work like physical barriers directing flow geometry to prevent mixing. The separator component may operate selectively or non-selectively in its ion permeability. The separator component can have any suitable thickness and hardness. In some embodiments, the separator component is in the form of a membrane, as well known in the art.

In a particular embodiment, the separator component is an ion-selective membrane. The ion-selective membrane, also known as an ion exchange membrane (IEM), can be any the organic, inorganic (e.g., ceramic), hybrid, or composite membranes known in the art, such as those used in redox flow batteries of the art and suitable for the purposes of the invention described herein. The ion-selective membrane should substantially or completely block passage of the redox active molecule between positive and negative compartments while permitting the flow of solvent molecules and/or ion species that may evolve or be present during the electron transport process, such as hydrogen ions, halide ions, or metal ions. In some embodiments, the ion-selective membrane is a cation-selective membrane, while in other embodiments, the ion-selective membrane is an anion-selective membrane. The ion-selective membrane can include or be composed of, for example, poly(phthalazinone ether ketone) (PPEK) or sulfonated version thereof (SPPEK), poly(phthalazinone ether sulfone) (PPES) or sulfonated version thereof (SPPES), poly(phthalazinone ether sulfone ketone) (PPESK) or sulfonated version thereof (SPPESK), or an ionomer, which may be a proton conductor or proton exchange membrane, particularly a fluoropolymer (e.g., a fluoroethylene or fluoropropylene), such as a sulfonated tetrafluoroethylene-based fluoropolymer, such as Nafion®. In some embodiments, the ion-selective membrane has a hybrid structure having an organic component, such as any of the exemplary organic compositions above, in combination with an inorganic material, such as silicon ($SiO_2$). The hybrid structure can be produced by, for example, a sol gel process. The ion-selective membrane may alternatively be a composite, which includes separate layers of different membrane materials in contact with each other. The choice of membrane material may be dependent on the choice of redox active molecule, solvent, and other aspects of the redox flow battery in particular embodiments. For this reason, any of the specific classes or types of separator materials described above may be excluded or specifically selected in particular embodiments.

As the SFB operates by flowing the electrolyte solutions over the respective electrodes, the SFB includes means capable of establishing flow of the electrolyte solutions. The means may be mechanical means, such as a pump; however, other means for establishing flow are possible, including, for example, a propeller designed for use within a liquid. Typically, the SFB includes at least two flow devices, one designated for establishing flow in the positive compartment, and the other designated for establishing flow in the negative compartment. The means for establishing flow may alternatively be provided by, for example, a gravity driven pumping arrangement.

The SFB also includes electrical communication means for establishing electrical communication between the positive and negative electrodes in order to permit the SFB to be charged and discharged. In a particular embodiment, the electrical communication means include wiring means, i.e., the presence of wiring and associated bonding pads and the like sufficient for establishing electrical connection. However, the electrical communication means does not necessarily have to be in the form of wiring. For example, electrical communication may be established by assembling multiple electrodes and multiple flow channels in a stacked bipolar configuration so that electrical connections need only be made to the first and last electrodes. Alternatively, electrical communication may be facilitated by exposing two geometric areas of a photoelectrode (e.g. a "front surface" and a "back surface") to the positive and negative electrolytes, respectively, such that one of the geometric areas functions as a positive electrode and the other geometric area functions as a negative electrode.

The SFB should also include an external load for accessing electrical energy produced by the SFB. Generally, switching means are included in order to operate the SFB in either a charging or discharging mode. For example, when operating in a charging mode, a switch establishing connection between positive and negative electrodes and an external load is disengaged (i.e., open), and in the discharging mode, the switch establishing circuitry between positive and negative electrodes and an external load is engaged.

The positive and negative electrolyte solutions contain the first and second redox active molecules, respectively, dissolved in a solvent. The solvent can be any solvent that is non-reactive with the redox active molecule and permits the redox active molecule to efficiently undergo redox reactions such that the SFB can be effectively charged and discharged. The solvent can be, for example, aqueous-based or non-aqueous (organic), protic or aprotic, and either polar or non-polar. The aqueous-based solvent can be, for example, water, or water in admixture with a water-soluble co-solvent. Some examples of protic organic solvents include the alcohols, such as methanol, ethanol, n-propanol, isopropanol, n-butanol, sec-butanol, isobutanol, t-butanol, n-pentanol, isopentanol, 3-pentanol, neopentyl alcohol, n-hexanol, 2-hexanol, 3-hexanol, 3-methyl-1-pentanol, 3,3-dimethyl-1-butanol, isohexanol, and cyclohexanol. The protic organic solvent may alternatively be or include a carboxylic acid, such as acetic acid, propionic acid, butyric acid, or a salt thereof. Some examples of polar aprotic solvents include nitrile solvents (e.g., acetonitrile, propionitrile, and butyronitrile), sulfoxide solvents (e.g., dimethyl sulfoxide, ethyl methyl sulfoxide, diethyl sulfoxide, methyl propyl sulfoxide, and ethyl propyl sulfoxide), sulfone solvents (e.g., methyl sulfone, ethyl methyl sulfone, methyl phenyl sulfone, methyl isopropyl sulfone, propyl sulfone, butyl sulfone, tetramethylene sulfone, i.e., sulfolane), amide solvents (e.g., N,N-dimethylformamide, N,N-diethylformamide, acetamide, dimethylacetamide, and N-methylpyrrolidone), ether solvents (e.g., diethyl ether, 1,2-dimethoxyethane, 1,2-diethoxyethane, 1,3-dioxolane, and tetrahydrofuran), carbonate solvents (e.g., propylene carbonate, ethylene carbonate, butylene carbonate, chloroethylene carbonate, fluorocarbonate solvents, dimethyl carbonate, diethyl carbonate, dipropyl carbonate, ethyl methyl carbonate, methyl propyl carbonate, and ethyl propyl carbonate), organochloride solvents (e.g., methylene chloride, chloroform, 1,1,-trichloroethane), ketone solvents (e.g., acetone and 2-butanone), and ester solvents (e.g., 1,4-butyrolactone, ethylacetate, methylpropionate, ethylpropionate, and the formates, such as methyl formate and ethyl formate). The polar aprotic solvent may also be or include, for example, hexamethylphosphoramide (HMPA), 1,3-dimethyl-3,4,5,6-tetrahydro-2 (1H)-pyrimidinone (DMPU), or propylene glycol monomethyl ether acetate (PGMEA). Some examples of polar inorganic solvents include supercritical carbon dioxide, carbon disulfide, carbon tetrachloride, ammonia, and sulfuryl chloride fluoride. Some examples of non-polar solvents include the liquid hydrocarbons, such as the pentanes, hexanes, heptanes, octanes, pentenes, hexenes, heptenes, octenes, benzene, toluenes, and xylenes. In yet other embodiments, the solvent may be an ionic liquid, either alone or in admixture with a non-ionic liquid solvent.

The redox active molecule is dissolved in the solvent in any suitable concentration, typically a concentration of at least 0.05 molar (0.05 M). In different embodiments, depending on the redox active molecule, solvent, and other conditions, the concentration of the redox active molecule is about, at least, or above, for example, 0.05 M, 0.1 M, 0.2 M, 0.3 M, 0.4 M, 0.5 M, 0.6 M, 0.7 M, 0.8 M, 0.9 M, 1.0 M, 1.1 M, 1.2 M, 1.3 M, 1.4 M, 1.5M, 2 M, 2.5 M, 3 M, 4 M, 5 M, 6 M, 7 M, 8 M, 9 M, or 10 M, or a concentration within a range bounded by any two of the foregoing exemplary values. As used herein, the term "about" generally indicates within ±0.5%, 1%, 2%, 5%, or up to ±10% of the indicated value. For example, an amount of "about 1 M" generally indicates, in its broadest sense, 1 M±10%, which indicates 0.9-1.1 M.

The electrolyte solutions may also include one or more supporting electrolytes, which may be organic, inorganic, or a combination thereof. The supporting electrolyte is any salt compound that contains a cationic portion (e.g., alkali, alkaline earth, main group, transition metal, or ammonium species) in combination with an anionic portion (e.g., halide, phosphate, perchlorate, sulfate, carbonate, bicarbonate, nitrate, manganate, vanadate, or carboxylate species). Some examples of alkali metal salts include the lithium halides (e.g., LiF, LiCl, LiBr, LiI), sodium halides (e.g., NaF, NaCl, NaBr, NaI), potassium halides (e.g., KF, KCl, KBr, KI), rubidium halides (e.g., RbF, RbCl, RbBr, RbI), lithium phosphate, lithium hexafluorophosphate, lithium hexafluoroarsenate, lithium perchlorate, sodium perchlorate, and lithium sulfate. Some examples of alkaline earth metal salts include magnesium halides (e.g., $MgF_2$, $MgCl_2$, $MgBr_2$, $MgI_2$), calcium halides (e.g., $CaF_2$, $CaCl_2$, $CaBr_2$, $CaI_2$), strontium halides (e.g., $SrF_2$, $SrCl_2$, $SrBr_2$, $SrI_2$), barium halides (e.g., $BaF_2$, $BaCl_2$, $BaBr_2$, $BaI_2$), and magnesium sulfate. Some examples of ammonium salts include the inorganic ammonium halides (e.g., $NH_4F$, $NH_4Cl$, $NH_4Br$, $NH_4I$), organic ammonium halides (e.g., $MeNH_3Cl$, $Me_2NH_2Cl$, $Me_3NHCl$, $Me_4NCl$, $Et_4NCl$, $Bu_4NF$, $Bu_4NBr$, where Me is methyl, Et is ethyl, and Bu is n-butyl), ammonium perchlorates (e.g., tetrabutylammonium perchlorate, i.e., "TBAP"), and ammonium hydroxides. Generally, the RFB is operated such that only the redox active molecule, and not a supporting electrolyte, undergoes a redox reaction.

The supporting electrolyte can be included in any suitable concentration, typically at least 0.01 M. In different embodiments, the supporting electrolyte is included in the electrolyte in a concentration of about, at least, above, up to, or less than, for example, 0.01 M, 0.05 M, 0.1 M, 0.2 M, 0.3 M, 0.4 M, 0.5 M, 0.6 M, 0.7 M, 0.8 M, 0.9 M, 1.0 M, 1.1 M, 1.2 M, 1.3 M, 1.4 M, 1.5M, 2 M, 2.5 M, 3 M, 4 M, 5 M, 6 M, 7 M, 8 M, 9 M, or 10 M, or a concentration within a range bounded by any two of the foregoing exemplary values.

In one embodiment, the electrolyte solutions contained in the positive and negative compartments constitute the entire amount of electrolyte solution in the SFB, i.e., no further reserve of electrolyte solution is connected with the positive and negative compartments. In another embodiment, the positive and negative compartments are each connected by one or more conduit means (e.g., a pipe or a channel) to storage (reservoir) tanks containing additional electrolyte solution. The storage tanks can advantageously serve to replenish spent electrolyte solution and increase the electrical capacity of the SFB. The storage tanks can also advantageously serve to promote flow of the electrolyte solutions, particularly in an arrangement where the positive and negative compartments are each connected to at least two storage tanks, in which case the SFB would have at least four storage tanks. In the case of each compartment being connected to at least two storage tanks, one of the storage tanks can function as an electrolyte acceptor and the other as an electrolyte provider. The foregoing arrangement may be particularly advantageous in establishing flow of the electrolyte past the electrodes. Upon depletion of the provider tank, the roles of the tanks reverse in order to maintain flow.

The redox active molecule can be any molecule that can undergo a reversible redox reaction and remain dissolved in solution when changed in oxidation state. To do this, the redox active molecule should not decompose to form a solid or gaseous species. The term "reversible," as used herein, indicates that the redox active molecule does not decompose or change phase when being oxidized or reduced under the conditions employed in the SFB. The term "molecule," as used herein, may or may not include a polymer, which is generally defined herein as a structure having at least or more than three, four, or five repeating units. Thus, in some embodiments, the redox active molecule may have up to or less than 3, 4, or 5 repeating units. The term "molecule," as used herein, may or may not include metal complexes (i.e., metal-ligand or organometallic complexes) where the metal in the metal complex may or may not undergo a redox reaction during operation of the SFB.

In a first embodiment, the redox active molecule is an inorganic molecule (i.e., "inorganic metal compound". The term "inorganic," as used herein, refers to any molecule that does not possess at least one carbon atom engaged in a covalent bond with at least one other carbon atom or a hydrogen atom. Generally, an inorganic molecule having a redox active property is a metal salt in which at least one cationic metal species is engaged or associated with one or more inorganic anionic species by one or more ionic bonds. The metal in the metal salt may or may not be redox active in the SFB. If the metal is not active, then one or more of the associated inorganic anionic species is redox active in the SFB. The term "molecule" or "compound", when used in the phrase "inorganic molecule" or "inorganic compound," may, in one embodiment, refer to a molecule or a compound in the sense of a discrete and precise unit of matter, or, by a second embodiment, may refer to a material with no general understood discreteness or precision in its composition. The metal species can be, for example, a transition metal species (e.g., Groups 3 to 12 of the Periodic Table), main group metal species (e.g., Groups 13 to 16 of the Periodic Table), alkali metal species (i.e., Group 1 of the Periodic Table), alkaline earth metal species (i.e., Group 2 of the Periodic Table), or lanthanide or actinide metal species. In particular embodiments, the one or more metals are selected from Li, Na, K, Mg, Ca, Ti, V, Cr, Mn, Fe, Co, Ni, Cu, Zn, La, Ce, Np, and U. The anionic species can be, for example, a halide, phosphate, perchlorate, sulfate, carbonate, bicarbonate, nitrate, manganate, vanadate, molybdate, tungstate, or carboxylate species. In some embodiments, the inorganic redox active molecule is any of those types of molecules used in conventional RFBs of the art, e.g., a metal halide compound or complex, or more particularly, an alkali metal salt, iron salt, chromium salt, or vanadium salt compound or complex. In some embodiments, the inorganic metal compound is a hydrogen halide, i.e., HX, wherein X is selected from a halide, such as Cl, Br, or I.

In a second embodiment, the redox active molecule is an organometallic compound or complex. As understood in the art, an organometallic compound or complex includes at least one covalent or non-covalent bond, such as a coordination or dative bond, between the organic (e.g., ligand) component and the metal species. Generally, the organometallic species includes a redox active metal atom, which may be any of the metal species described above. The organic ligand component possesses at least one carbon atom engaged in a covalent bond with at least one other carbon atom or a hydrogen atom. The organic ligand can be any of the numerous ligands known in the art, and which does not interfere with the operation of the SFB. In order to prevent decomposition or precipitation of the metal, the ligand should remain coordinated to the metal while the metal changes its oxidation state. The organic ligand can be, for example, a hydrocarbon group with or without heteroatom substitution and generally includes one or more functional groups for binding with the metal. Some examples of organic ligands include cyclopentadienyl, alkoxy, phenoxy, amine, thioalkoxy, thiophenoxy, carboxylate, and phosphine ligands. The organic ligand may or may not be accompanied by one or more inorganic ligands, such as a halide, oxo, or carbonyl group, also bound to the metal.

In a third embodiment, the redox active molecule is an organic molecule. The term "organic," as used herein, refers to any molecule that possesses at least one carbon atom engaged in a covalent bond with at least one other carbon atom and/or a hydrogen atom. In some embodiments, the organic redox active molecule possesses only covalent bonds. In some embodiments, the organic redox active molecule is not a metal complex. In some embodiments, the organic redox active molecule can include one or more metals if only the organic component of the molecule, and not the one or more metals, undergoes a redox reaction during operation of the SFB. In some embodiments, the organic redox active molecule considered herein does not include an element other than carbon, hydrogen, halogen (e.g., fluorine, chlorine, bromine, or iodine), nitrogen, oxygen, sulfur, and phosphorus, or includes a further limited selection of such elements. In other embodiments, the organic redox active molecule does not include a metal of any kind.

In particular embodiments, the redox active molecule is an organic molecule containing an aromatic ring or an acyclic unsaturated group having a π-conjugated system. The aromatic ring can be monocyclic, bicyclic, tricyclic, or a higher polycyclic ring system, and can be carbocyclic (no ring heteroatoms) or heterocyclic (one or more ring heteroatoms). Numerous such types of aromatic and heteroaromatic rings and ring systems are further described below, all of which apply herein. Some examples of such aromatic or heteroaromatic organic redox molecules include those containing a benzene ring, naphthalene ring, anthracene ring, phenanthrene ring, phenalene ring, fluorene ring, azulene ring, acenaphthene ring, chrysene ring, pyrene ring, tetracene ring, triphenylene ring, benzopyrene ring, perylene ring, furan ring, thiophene ring, phenanthroline ring, pyrrole ring, imidazole ring, pyridine ring, pyrazole ring, pyrazine ring, triazine ring, and the like. Some examples of acyclic conjugated organic redox molecules include those containing a conjugated ether, enone, enedione, or ene-nitrile moiety. Any of the foregoing rings may be either unsubstituted or substituted with one or more hydrocarbon groups (R) or heteroatom-containing groups further discussed below. Some more specific examples of such organic redox molecules include redox active phenylene-vinylene molecules and oligomers, π-conjugated porphyrins, diaryl- and triarylamines, 2,5-bis(methylthio)thieno[3,2-b]thiophene, and N,N-diethyl-p-phenylenediamine. In some embodiments, the organic redox active molecule contains a quinone ring, or a benzoquinone ring system, or an anthraquinone ring system, wherein the quinone moiety may be a 1,4- or 1,2-quinone. The term "quinone ring," as used herein, can also (unless otherwise specified) include a "thioquinone ring," wherein a thioquinone ring may have one or both quinonyl oxygen atoms substituted with sulfur atoms. In other embodiments, the organic redox active molecule is a soluble species that shares chemical functionality with supercapacitor materials known in the art, and may be an electrochemiluminescent (ECL) molecule, such as 9,10-diphenylanthracene. Any of the foregoing rings or ring systems may or may not include one or more heteroatoms or heteroatom-containing groups, as further discussed below. Numerous such organic molecules are commercially available or can be prepared by well known synthetic procedures.

In other embodiments, the organic redox active molecule is chosen from those molecules containing functional groups that are well known in the art to facilitate stable redox reactivity. Examples of such molecules include, for example, 1,1'-dimethyl-4,4'-bipyridinium dichloride, 1,1'-dibenzyl-4,4'-bipyridinium dichloride, 2,3,5,6-tetramethyl-1,4-benzoquinone, N,N,N',N'-tetramethyl-p-phenylenediamine, bis(2-thienyl)ketone, and di-2-thienylethanedione.

In some embodiments, the SFB described herein employs an anthraquinone-containing molecule as the redox active species in the electrolyte solution. The anthraquinone-containing can be conveniently expressed by the following formula:

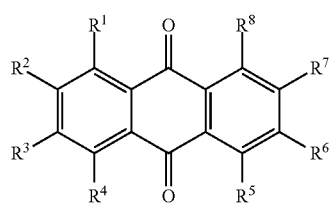

(1)

In Formula (1) above, $R^1$, $R^2$, $R^3$, $R^4$, $R^5$, $R^6$, $R^7$, and $R^8$ are independently selected from, for example: hydrogen atom; hydrocarbon groups R having one to twenty carbon atoms with optional inclusion of one or more heteroatoms selected from oxygen, nitrogen, sulfur, and halogen atoms (e.g., fluorine, chlorine, bromine, and/or iodine), wherein the hydrocarbon group R is attached to the shown ring by a carbon atom; halogen atoms; nitrile groups (CN); amino groups —$NR^9R^{10}$, wherein $R^9$ and $R^{10}$ are independently selected from hydrogen atom and hydrocarbon groups R; hydroxy groups; ether groups —OR; carboxamide groups —C(O)$NR^9R^{10}$ or —$NR^9$C(O)R; keto groups —C(O)R;

carboxylic acid groups —C(O)OH or salt thereof; ester groups —C(O)OR; sulfonate (—S(O)$_2$OH, salt thereof, or —S(O)$_2$OR); phosphonate (—P(O)(OH)$_2$R, salt thereof, or —P(O)(OR)$_2$R); and nitrate (—NO$_2$), wherein two or more of $R^1$, $R^2$, $R^3$, $R^4$, $R^5$, $R^6$, $R^7$, and $R^8$ can optionally interconnect to form one or more additional rings on the anthraquinone ring system. Each occurrence of an oxygen atom in any of the foregoing groups may or may not be replaced with a sulfur atom to result in the corresponding thio analog, e.g., ether groups (OR) are intended to also include thioether (SR) groups, and keto groups (C(O)R) are intended to also include thioacyl groups (C(S)R), unless otherwise specified. Numerous such organic molecules are commercially available or can be prepared by well known synthetic procedures, as found, for example, in International PCT Publication WO 2014011753 and U.S. Pat. No. 3,836, 547, the contents of which are herein incorporated by reference. Moreover, one or both of the quinonyl oxygen atoms shown in Formula (1) may be substituted with sulfur atoms.

In some embodiments, at least one of said $R^1$, $R^2$, $R^3$, $R^4$, $R^5$, $R^6$, $R^7$, and $R^8$ groups is an amino group of the formula —NR$^9$R$^{10}$. In other embodiments, at least two, three, four, five, or all of the $R^1$, $R^2$, $R^3$, $R^4$, $R^5$, $R^6$, $R^7$, and $R^8$ groups are amino groups of the formula —NR$^9$R$^{10}$. In a first embodiment, at least one of $R^9$ and $R^{10}$ groups in the formula —NR$^9$R$^{10}$ is a hydrogen atom, or both of $R^9$ and $R^{10}$ groups are hydrogen atoms. In a second embodiment, at least one of $R^9$ and $R^{10}$ groups in the formula —NR$^9$R$^{10}$ is a hydrocarbon group R, or both of $R^9$ and $R^{10}$ groups are hydrocarbon groups R. In some embodiments, $R^9$ and $R^{10}$ are independently selected from hydrogen atom and saturated or unsaturated hydrocarbon groups (or alkyl or alkenyl groups) containing at least one or two and up to three, four, five, or six carbon atoms.

As used herein, the term "hydrocarbon group" (also denoted by the group R) is, in a first embodiment, composed solely of carbon and hydrogen. In different embodiments, one or more of the hydrocarbon groups or linkers can contain precisely, or a minimum of, or a maximum of, for example, one, two, three, four, five, six, seven, eight, nine, ten, eleven, twelve, thirteen, fourteen, fifteen, sixteen, seventeen, eighteen, nineteen, or twenty carbon atoms, or a number of carbon atoms within a particular range bounded by any two of the foregoing carbon numbers. Hydrocarbon groups or linkers in different compounds described herein, or in different positions of a compound, may possess the same or different number (or preferred range thereof) of carbon atoms in order to independently adjust or optimize the activity or other characteristics of the compound. The term "hydrocarbon linker", as used herein, is a linking group that may be derived by any of the hydrocarbon groups by including at least one additional linking point by removal of one or more hydrogen atoms from the group (e.g., a —CH$_2$CH$_2$— or >CHCH$_3$ linking group can be derived from an ethyl (—CH$_2$CH$_3$) group by removal of one of the hydrogen atoms of the ethyl group, either from an adjacent carbon atom or same carbon atom, respectively).

The hydrocarbon groups or linkers (R) can be, for example, saturated and straight-chained (i.e., straight-chained alkyl groups or alkylene linkers). Some examples of straight-chained alkyl groups (or alkylene linkers) include methyl (or methylene linker, i.e., —CH$_2$—, or methine linker), ethyl (or ethylene or dimethylene linker, i.e., —CH$_2$CH$_2$— linker), n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, and n-eicosyl groups (or their respective linker analogs).

The hydrocarbon groups or linkers (R) can alternatively be saturated and branched (i.e., branched alkyl groups or alkylene linkers). Some examples of branched alkyl groups include isopropyl (2-propyl), isobutyl (2-methylprop-1-yl), sec-butyl (2-butyl), t-butyl (1,1-dimethylethyl-1-yl), 2-pentyl, 3-pentyl, 2-methylbut-1-yl, isopentyl (3-methylbut-1-yl), 1,2-dimethylprop-1-yl, 1,1-dimethylprop-1-yl, neopentyl (2,2-dimethylprop-1-yl), 2-hexyl, 3-hexyl, 2-methylpent-1-yl, 3-methylpent-1-yl, isohexyl (4-methylpent-1-yl), 1,1-dimethylbut-1-yl, 1,2-dimethylbut-1-yl, 2,2-dimethylbut-1-yl, 2,3-dimethylbut-1-yl, 3,3-dimethylbut-1-yl, 1,1,2-trimethylprop-1-yl, and 1,2,2-trimethylprop-1-yl groups, isoheptyl, isooctyl, and the numerous other branched alkyl groups having up to 20 carbon atoms, wherein the "1-yl" suffix represents the point of attachment of the group. Some examples of branched alkylene linkers are those derived by removal of a hydrogen atom from one of the foregoing exemplary branched alkyl groups (e.g., isopropylene, —CH(CH$_3$)CH$_2$—).

The hydrocarbon groups or linkers (R) can alternatively be saturated and cyclic (i.e., cycloalkyl groups or cycloalkylene linkers). Some examples of cycloalkyl groups include cyclopropyl, cyclobutyl, cyclopentyl, cyclohexyl, cycloheptyl, and cyclooctyl groups. The cycloalkyl group can also be a polycyclic (e.g., bicyclic) group by either possessing a bond between two ring groups (e.g., dicyclohexyl) or a shared (i.e., fused) side (e.g., decalin and norbornane). Some examples of cycloalkylene linkers are those derived by removal of a hydrogen atom from one of the foregoing exemplary cycloalkyl groups.

The hydrocarbon groups or linkers (R) can alternatively be unsaturated and straight-chained (i.e., straight-chained olefinic or alkenyl groups or linkers). The unsaturation occurs by the presence of one or more carbon-carbon double bonds and/or one or more carbon-carbon triple bonds. Some examples of straight-chained olefinic groups include vinyl, propen-1-yl (allyl), 3-buten-1-yl (CH$_2$=CH—CH$_2$—CH$_2$—), 2-buten-1-yl (CH$_2$—CH=CH—CH$_2$—), butadienyl, 4-penten-1-yl, 3-penten-1-yl, 2-penten-1-yl, 2,4-pentadien-1-yl, 5-hexen-1-yl, 4-hexen-1-yl, 3-hexen-1-yl, 3,5-hexadien-1-yl, 1,3,5-hexatrien-1-yl, 6-hepten-1-yl, ethynyl, propargyl (2-propynyl), and the numerous other straight-chained alkenyl groups having up to 20 carbon atoms. Some examples of straight-chained olefinic linkers are those derived by removal of a hydrogen atom from one of the foregoing exemplary straight-chained olefinic groups (e.g., vinylene, —CH=CH—, or vinylidene).

The hydrocarbon groups or linkers (R) can alternatively be unsaturated and branched (i.e., branched olefinic or alkenyl groups or linkers). Some examples of branched olefinic groups include propen-2-yl (CH$_2$=C.—CH$_3$), 1-buten-2-yl (CH$_2$=C.—CH$_2$—CH$_3$), 1-buten-3-yl (CH$_2$=CH—CH.—CH$_3$), 1-propen-2-methyl-3-yl (CH$_2$=C(CH$_3$)—CH$_2$—), 1-penten-4-yl, 1-penten-3-yl, 1-penten-2-yl, 2-penten-2-yl, 2-penten-3-yl, 2-penten-4-yl, and 1,4-pentadien-3-yl, wherein the dot in any of the foregoing groups indicates a point of attachment. Some examples of branched olefinic linkers are those derived by removal of a hydrogen atom from one of the foregoing exemplary branched olefinic groups.

The hydrocarbon groups or linkers (R) can alternatively be unsaturated and cyclic (i.e., cycloalkenyl groups or cycloalkenylene linkers). The unsaturated and cyclic group can be aromatic or aliphatic. Some examples of unsaturated and cyclic hydrocarbon groups include cyclopropenyl, cyclobutenyl, cyclopentenyl, cyclopentadienyl, cyclohexenyl, cyclohexadienyl, phenyl, benzyl, cycloheptenyl, cycloheptadienyl, cyclooctenyl, cyclooctadienyl, and cyclooctatetraenyl groups. The unsaturated cyclic hydrocarbon group can also be a polycyclic group (such as a bicyclic or tricyclic polyaromatic group) by either possessing a bond between two of the ring groups (e.g., biphenyl) or a shared (i.e., fused) side, as in naphthalene, anthracene, phenanthrene, phenalene, or indene fused ring systems. Some examples of cycloalkenylene linkers are those derived by removal of a hydrogen atom from one of the foregoing exemplary cycloalkenyl groups (e.g., phenylene and biphenylene).

One or more of the hydrocarbon groups or linkers (R) may (i.e., optionally) include one or more heteroatoms, which are non-carbon non-hydrogen atoms. Some examples of heteroatoms include oxygen (O), nitrogen (N), sulfur (S), and halogen (halide) atoms. Some examples of halogen atoms include fluorine, chlorine, bromine, and iodine. In some embodiments, the heteroatom atom inserts between at least two carbon atoms (as in —C—O—C— ether, —C—S—C— thioether, —C—N(R)—C— tertiary amine, or —C=N—C— imine) or between at least one carbon atom and at least one hydrogen atom (as in —C—OH, —C—SH, —C—NH$_2$, —C—NH—C—, or —C(=NH)C—), wherein the shown carbon atom in each case can be considered part of a hydrocarbon group R described above. In other embodiments, the heteroatom replaces (i.e., substitutes) one or more hydrogen atoms and/or one or more carbon atoms in the hydrocarbon group, as in halogen-substituted groups (e.g., a —CH$_2$F, —CHF$_2$, and —CF$_3$) and carbonyl-substituted groups, such as ketone and aldehyde groups. In some embodiments, the hydrocarbon is substituted with multiple oxygen atoms to result in a dialkyleneoxide or polyalkyleneoxide group, such as a diethyleneoxide or polyethyleneoxide group. In the case of nitrogen or sulfur substitution, the nitrogen or sulfur atom may be bonded to a sufficient number of groups to make it positively charged, as in an ammonium group (e.g., —NR'$_3^+$) or sulfonium group (e.g., —SR'$_2^+$), in which case the positively charged moiety is necessarily associated with a counteranion (wherein R' independently represents hydrogen atom or any of the hydrocarbon groups described above). Likewise, a heteroatom may bear a negative charge, as in a deprotonated carboxy, thiocarboxy, sulfonate, phosphonate, hydroxy, or thiol group, in which case the negatively charged moiety is necessarily associated with a countercation.

When two or more same or different heteroatoms are bound to each other or located on the same carbon atom, the resulting group containing the heteroatoms is herein referred to as a "heteroatom-containing group". Thus, inclusion or substitution of a hydrocarbon group with one or more heteroatoms also includes heteroatom-containing groups, unless otherwise specified. Some examples of heteroatom-containing groups and linkers include carboxy (—C(O)OR' or —OC(O)R'), thiocarboxy (—C(S)OR' or —OC(S)R'), carboxamide (—C(O)NR'$_2$, —C(O)NR'—, or —N(R')C(O)—), urea (—NR'—C(O)—NR'$_2$ or —NR'—C(O)—NR'—), thiourea (—NR'—C(S)—NR'$_2$ or —NR'—C(S)—NR'—), carbamate (—NR'—C(O)—OR', —OC(O)—NR'$_2$, or —NR'—C(O)—O—), thiocarbamate (—NR'—C(S)—OR', —OC(S)—NR'$_2$, or —NR'—C(S)—O—), nitro (NO$_2$), nitrile (CN), sulfonyl (—S(O)$_2$R' or —S(O)$_2$—), sulfinyl (i.e., sulfoxide, —S(O)R' or —S(O)—), disulfide (—C—S—S—C—), sulfonate (—S(O)$_2$OR'), sulfate (—OS(O)$_2$OR'), and amine oxide (as typically found in a nitrogen-containing ring), wherein R' independently represents hydrogen atom or any of the hydrocarbon groups (R) described above. For example, —C(O)OR' includes carboxylic acid (—C(O)OH) and carboxylic ester (—C(O)OR), where R is any of the hydrocarbon groups described above. The heteroatom-containing group may also either insert between carbon atoms or between a carbon atom and hydrogen atom, if applicable, or replace one or more hydrogen and/or carbon atoms.

In some embodiments, the hydrocarbon group or linker (R) is substituted with one or more halogen atoms to result in a partially halogenated or perhalogenated hydrocarbon group. Some examples of partially halogenated hydrocarbon groups include —CHY$_2$, —CH$_2$Y, —CH$_2$CY$_3$, —CH(CY$_3$)$_2$, or a halo-, dihalo-, trihalo-, or tetrahalo-substituted phenyl group, wherein Y represents any of F, Cl, Br, or I, and more commonly F or Cl. Some examples of perhalogenated hydrocarbon groups include —CY$_3$, —CY$_2$CY$_3$, —CY$_2$CY$_2$CY$_3$, —CY(CY$_3$)$_2$, or perhalophenyl, —C$_6$Y$_5$).

In some embodiments, the hydrocarbon group (R) is, or includes, a cyclic or polycyclic (i.e., bicyclic, tricyclic, or higher cyclic) saturated or unsaturated (e.g., aliphatic or aromatic) hydrocarbon group that includes at least one ring heteroatom, such as one, two, three, four, or higher number of ring heteroatoms. Such heteroatom-substituted cyclic hydrocarbon groups are referred to herein as "heterocyclic groups". As used herein, a "ring heteroatom" is an atom other than carbon and hydrogen (typically, selected from nitrogen, oxygen, and sulfur) that is inserted into or replaces a ring carbon atom in a hydrocarbon ring structure. In some embodiments, the heterocyclic group is saturated. In other embodiments, the heterocyclic group is unsaturated, i.e., aliphatic or aromatic heterocyclic groups, wherein the aromatic heterocyclic group is also referred to herein as a "heteroaromatic ring", or a "heteroaromatic fused-ring system" in the case of at least two fused rings, at least one of which contains at least one ring heteroatom. The heterocyclic group may be bound via a ring carbon atom or ring heteroatom to the remainder of the sirtuin inhibiting compound, either directly or via any of the linking groups or atoms described herein.

Some examples of saturated heterocyclic groups containing at least one oxygen atom include oxetane, tetrahydrofuran, tetrahydropyran, 1,4-dioxane, 1,3-dioxane, and 1,3-dioxepane rings. Some examples of saturated heterocyclic groups containing at least one nitrogen atom include pyrrolidine, piperidine, piperazine, imidazolidine, azepane, and decahydroquinoline rings. Some examples of saturated heterocyclic groups containing at least one sulfur atom include tetrahydrothiophene, tetrahydrothiopyran, 1,4-dithiane, 1,3-dithiane, and 1,3-dithiolane rings. Some examples of saturated heterocyclic groups containing at least one oxygen atom and at least one nitrogen atom include morpholine and oxazolidine rings. An example of a saturated heterocyclic group containing at least one oxygen atom and at least one sulfur atom includes 1,4-thioxane. An example of a saturated heterocyclic group containing at least one nitrogen atom and at least one sulfur atom includes thiazolidine and thiamorpholine rings.

Some examples of unsaturated heterocyclic groups containing at least one oxygen atom include furan, pyran, 1,4-dioxin, benzofuran, dibenzofuran, and dibenzodioxin rings. Some examples of unsaturated heterocyclic groups containing at least one nitrogen atom include pyrrole, imidazole, pyrazole, pyridine, pyrazine, pyrimidine, 1,3,5-triazine, azepine, diazepine, indole, purine, benzimidazole, indazole, 2,2'-bipyridine, quinoline, isoquinoline, phenanthroline, 1,4,5,6-tetrahydropyrimidine, 1,2,3,6-tetrahydropyridine, 1,2,3,4-tetrahydroquinoline, quinoxaline, quinazoline, pyridazine, cinnoline, 5,6,7,8-tetrahydroquinoxaline, 1,8-naphthyridine, and 4-azabenzimidazole rings. Some examples of unsaturated heterocyclic groups containing at least one sulfur atom include thiophene, thianaphthene, benzothiophene, thiochroman, and thiochromene rings. Some examples of unsaturated heterocyclic groups containing at least one oxygen atom and at least one nitrogen atom include oxazole, isoxazole, benzoxazole, benzisoxazole, oxazoline, 1,2,5-oxadiazole (furazan), and 1,3,4-oxadiazole rings. Some examples of unsaturated heterocyclic groups containing at least one nitrogen atom and at least one sulfur atom include thiazole, isothiazole, benzothiazole, benzoisothiazole, thiazoline, and 1,3,4-thiadiazole rings.

In some embodiments, any of the generic substituents (e.g., R, $R_1$, $R_2$, and the like in Formula I) described above may independently exclude any one or more of the classes, subclasses, or particular hydrocarbon groups described above, or may independently include only specific hydrocarbon groups selected from the hydrocarbon groups (R) described above.

In a first set of embodiments, the redox active molecule according to Formula (I) contains one amino group of the formula —$NR^9R^{10}$, wherein $R^9$ and $R^{10}$ are independently selected from hydrogen atom and hydrocarbon groups R. The single amino group may be located at any of the eight ring positions corresponding to $R^1$, $R^2$, $R^3$, $R^4$, $R^5$, $R^6$, $R^7$, and $R^8$. The ring carbon atoms on which $R^1$, $R^2$, $R^3$, $R^4$, $R^5$, $R^6$, $R^7$, and $R^8$ are attached are designated as positions 1, 2, 3, 4, 5, 6, 7, and 8, respectively. Some examples of redox active molecules according to Formula (1) and containing a single amino group include 1-aminoanthraquinone, 2-aminoanthraquinone, 1-(methylamino)anthraquinone, 2-(methylamino)anthraquinone, 1-(dimethylamino)anthraquinone, 2-(dimethylamino)anthraquinone, 1-(ethylamino)anthraquinone, 2-(ethylamino)anthraquinone, 1-(diethylamino)anthraquinone, 2-(diethylamino)anthraquinone, 1-(propylamino)anthraquinone, 2-(propylamino)anthraquinone, 1-(dipropylamino)anthraquinone, 2-(dipropylamino)-anthraquinone, 1-(isopropylamino)anthraquinone, 2-(isopropylamino)anthraquinone, 1-(diisopropylamino) anthraquinone, 2-(diisopropylamino)anthraquinone, 1-(butylamino)-anthraquinone, 2-(butylamino)anthraquinone, 1-(dibutylamino)anthraquinone, 2-(dibutylamino)-anthraquinone, 1-(isobutylamino)anthraquinone, 2-(isobutylamino)anthraquinone, 1-(diisobutylamino)anthraquinone, 2-(diisobutylamino)anthraquinone, 1-(phenylamino)-anthraquinone (i.e., 1-anilinoanthraquinone), 2-anilinoanthraquinone, 1-(diphenylamino)-anthraquinone, 2-(diphenylamino)anthraquinone, 1-(p-tolyl)anthraquinone), 2-(p-tolyl)anthraquinone, 1-naphthylanthraquinone, 2-naphthylanthraquinone, 1-amino-2,4-dibromo-anthraquinone, 1-amino-2-bromo-4-hydroxy-anthraquinone, 1-amino-6-chloro-anthraquinone, 1-amino-4,5,8-trihydroxy-anthraquinone, 1-(3-methoxy-propylamino)-anthraquinone, 1-hydroxy-4-[[3-(2-methoxyethoxy)-propyl]amino]anthraquinone, 1,4-dihydroxy-2-[[3-(2-methoxyethoxy)propyl]amino]-anthraquinone, and their sulfonic acid derivatives.

In a second set of embodiments, the redox active molecule according to Formula (I) contains two amino groups of the formula —$NR^9R^{10}$, wherein $R^9$ and $R^{10}$ are independently selected from hydrogen atom and hydrocarbon groups R. The two amino groups may be located at any of the eight ring positions corresponding to $R^1$, $R^2$, $R^3$, $R^4$, $R^5$, $R^6$, $R^7$, and $R^8$. Some examples of redox active molecules according to Formula (1) and containing two amino groups include 1,2-diaminoanthraquinone, 1,3-diaminoanthraquinone, 2-hydroxy-1,3-diaminoanthraquinone, 1,4-diaminoanthraquinone, 2-bromo-1,4-diaminoanthraquinone, 2-acetyl-1,4-diaminoanthraquinone, 1,5-diaminoanthraquinone, 2-hydroxy-1,7-diaminoanthraquinone, 1,8-diaminoanthraquinone, 2,3-diaminoanthraquinone, 1-hydroxy-2,3-diaminoanthraquinone, 2,6-diaminoanthraquinone, 2,7-diaminoanthraquinone, 1-hydroxy-2,7-diaminoanthraquinone, 1,2-bis(methylamino)anthraquinone, 1,4-bis(methylamino)anthraquinone, 2,3-dichloro-1,4-bis(methylamino)anthraquinone, 1,5-bis(methylamino)anthraquinone, 1,8-dihydroxy-4,5-bis(methylamino)anthraquinone, 1,8-bis(methylamino)anthraquinone, 1,2-bis(dimethylamino)anthraquinone, 1,4-bis(dimethylamino)anthraquinone, 1,5-bis(dimethylamino)anthraquinone, 1,8-bis(dimethylamino)anthraquinone, 1,4-bis(isopropylamino)anthraquinone, 1-amino-4-(isopropylamino)anthraquinone, 1,4-dianilinoanthraquinone, 1,8-dianilinoanthraquinone, 1,4-bis-(p-tolylamino)anthraquinone, 1,8-bis-(p-tolylamino)anthraquinone, 1,4-diamino-2,3-dibromo-anthraquinone, 1-amino-2-bromo-4-((3-(dimethylamino)propyl)amino)anthraquinone, 1-[[3-(dimethylamino)propyl]amino]-4-[(4-methylphenyl)amino]anthraquinone, 1,4-bis-((3-(dimethylamino)propyl)amino)anthraquinone, 1-amino-4-[4-(dimethylaminomethyl)anilino]anthraquinone, 1-amino-4-(phenylamino)anthraquinone, and 1-amino-4,8-dihydroxy-5-(phenylamino)anthraquinone.

In a third set of embodiments, the redox active molecule according to Formula (I) contains three amino groups of the formula —$NR^9R^{10}$, wherein $R^9$ and $R^{10}$ are independently selected from hydrogen atom and hydrocarbon groups R. The three amino groups may be located at any of the eight ring positions corresponding to $R^1$, $R^2$, $R^3$, $R^4$, $R^5$, $R^6$, $R^7$, and $R^8$. Some examples of redox active molecules according to Formula (1) and containing three amino groups include 1,2,3-triaminoanthraquinone, 1,4,5-triaminoanthraquinone, 2-hydroxy-1,4,5-triaminoanthraquinone, 2-bromo-1,4,5-triaminoanthraquinone, 2,3-dibromo-1,4,5-triamino-anthraquinone, and 1,4-diamino-8-((3-(dimethylamino)propyl)amino)anthraquinone.

In a fourth set of embodiments, the redox active molecule according to Formula (I) contains four amino groups of the formula —$NR^9R^{10}$, wherein $R^9$ and $R^{10}$ are independently selected from hydrogen atom and hydrocarbon groups R. The four amino groups may be located at any of the eight ring positions corresponding to $R^1$, $R^2$, $R^3$, $R^4$, $R^5$, $R^6$, $R^7$, and $R^8$. Some examples of redox active molecules according to Formula (1) and containing four amino groups include 1,4,5,8-tetraaminoanthraquinone, 1,4,5,8-tetrakis(methylamino)anthraquinone, 1,4,5,8-tetrakis(dimethylamino)anthraquinone, 1,4,5,8-tetrakis(isopropylamino)anthraquinone, 1,4,5,8-tetrakis(diisopropylamino)anthraquinone, 1,4,5,8-tetraanilinoanthraquinone, 1,4,5,8-tetrakis(p-tolylamino)anthraquinone, 1,4,5,8-tetrakis[(3-methylphenyl)amino]anthraquinone, and 1,4,5,8-tetrakis (cyclohexylamino)anthraquinone.

A large proportion of the anthraquinone redox molecules described above can be obtained commercially. Many of the anthraquinone molecules are used as dyestuffs. Otherwise, the anthraquinone redox molecule can be prepared by means well known in the art, such as described in Y. Baqi et al., *Nature Protocols,* 5,-945-953 (2010); S. M. M. Nor et al., Molecules, 18, pp. 8046-8062 (2013); H. Naeimi et al., Dyes and Pigments, vol. 81, no. 3, June 2009, pp. 259-263; B. R. Madje et al., Green Chemistry Letters and Reviews, vol. 3, no. 4, December 2010, pp. 269-273; M. A. Gouda et al.,

*Turk. J. Chem.*, 34, pp. 651-709 (2010); and U.S. Pat. No. 3,249,626, the contents of which are herein incorporated by reference.

In another aspect, the invention is directed to a method for storing and releasing electrical energy by use of the above-described redox flow battery. In some embodiments, the SFB is operated in a symmetric mode. The term "symmetric," as used herein, refers to a design feature in the SFB in which the redox active molecule is the same in the electrolyte solutions contained in the positive and negative compartments of the SFB when the redox active molecule is in its neutral state, i.e., at rest, before the charging process or at completion of the discharging process. In other embodiments, the SFB is operated in an unsymmetric mode, i.e., the redox active molecules are different in the electrolyte solutions contained in the positive and negative compartments of the SFB when the redox active molecule is in its neutral state. When the first and second redox active molecules are different, the second redox active molecule (in the negative compartment) should possess a more negative redox potential than the first redox active molecule (in the positive compartment).

In the method, the SFB is first charged by exposing the semiconductor light absorber (photoelectrode) to solar irradiation while the external load is not in electrical communication with the positive and negative electrodes and while flowing the electrolyte solutions. The solar absorber converts electromagnetic energy to electrical energy, which is thereby supplied to the positive and negative electrodes. During the charging phase, the redox active molecule in the positive compartment (first redox active molecule) is oxidized and the redox active molecule in the negative compartment (second redox active molecule) is reduced. As such, inputted electrical energy has been converted and stored as electrochemical energy. The electrochemical energy is stored in the energetically uphill half reactions occurring in the positive and negative compartments during the charging process. The resulting electrochemical potential energy is stored until a discharging process occurs, during which the external load is in electrical communication with the positive and negative electrodes. In the discharging phase, stored electrochemical energy is converted to electrical energy while flowing the electrolyte solutions, with concomitant reversal of the two half reactions (i.e., reduction in the positive compartment and oxidation in the negative compartment) to form the initial lower energy redox molecules present in both compartments before the charging process. During the discharging phase, the oxidized version of the first redox active molecule in the positive electrolyte is reduced to regenerate the original positive electrolyte as provided before the charging process, and the reduced version of the second redox active molecule in the negative electrolyte is oxidized to regenerate the original negative electrolyte as provided before the charging process. The thermodynamically favorable reversal of the redox reactions in the discharging phase results in net electrical power output dissipated at the external load.

Each half reaction generally operates by one or more one-electron processes, but they may also operate by multi-electron processes (e.g., one or more two-, three-, or four-electron processes), depending on the redox active molecule. In embodiments where the redox active molecule exhibits a color change upon oxidation or reduction, the color change can be relied upon as an observation tool for readily determining the state of charge of the redox flow battery. In order to permit such visual referencing, the positive and negative compartment should include means for visually observing the electrolyte solutions. The means for visually observing the electrolyte can be, for example, use of a translucent or transparent material for the compartment material, or incorporation of a window in the wall of an opaque electrolyte compartment, or reliance on a visible spectroscopic device that indicates the state of the battery by measurement of the wavelength and intensity of the electrolyte.

A general schematic for the SFB process in which two electrodes are used is shown in FIG. 1. The figure depicts one electrode (at right) as a positive photoelectrode and the other electrode (at left) as a conventional negative electrode; however, in other embodiments, the polarities of the electrodes may be reversed, or both electrodes may be photoelectrodes, and the SFB may or may not contain more than two electrodes (e.g., three, four, fix, or six), at least one of which is a photoelectrode.

Figures 2A, 2B, 2C:
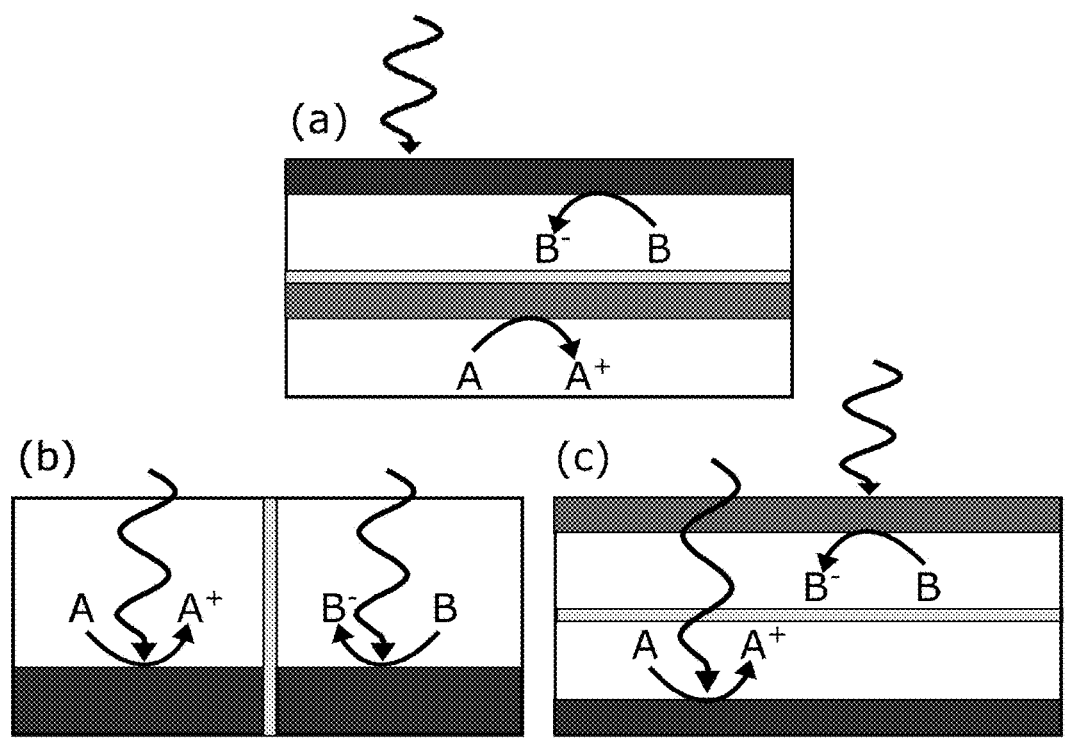
FIGS. 2A-2C. Schematic depictions of three different SFB charge cell designs: A single-absorber system wherein one absorber material provides sufficient photovoltage to drive two electrochemical half reactions along with a purely catalytic counter electrode (FIG. 2A); a side-by-side absorber systems wherein two absorbers each facilitate one half reaction (FIG. 2B); a stacked absorber system wherein two absorbers each facilitate one half reaction, but the top absorber selectively absorbs short wavelengths and the bottom absorber selectively absorbs long wavelengths (FIG. 2C).

FIGS. 2A-2C provide schematic depictions of three different SFB charge cell designs. The first configuration, shown in FIG. 2A, depicts a single-absorber system wherein one absorber material provides sufficient photovoltage (i.e., electrochemical potential) upon illumination to drive two electrochemical half-reactions (both energy storage half reactions) along with a purely catalytic counter electrode. The second configuration, shown in FIG. 2B, depicts a side-by-side absorber system wherein each of two light absorbers facilitates one half-reaction. The third configuration, shown in FIG. 2C, depicts a stacked absorber system wherein two absorbers in a stacked orientation (with respect to the incoming sunlight) each facilitate one half reaction, but the top absorber selectively absorbs short wavelengths and the bottom absorber selectively absorbs long wavelengths. For example, the top semiconductor may selectively absorb blue light, while the bottom semiconductor absorbs the remaining light.

Figure 3A:
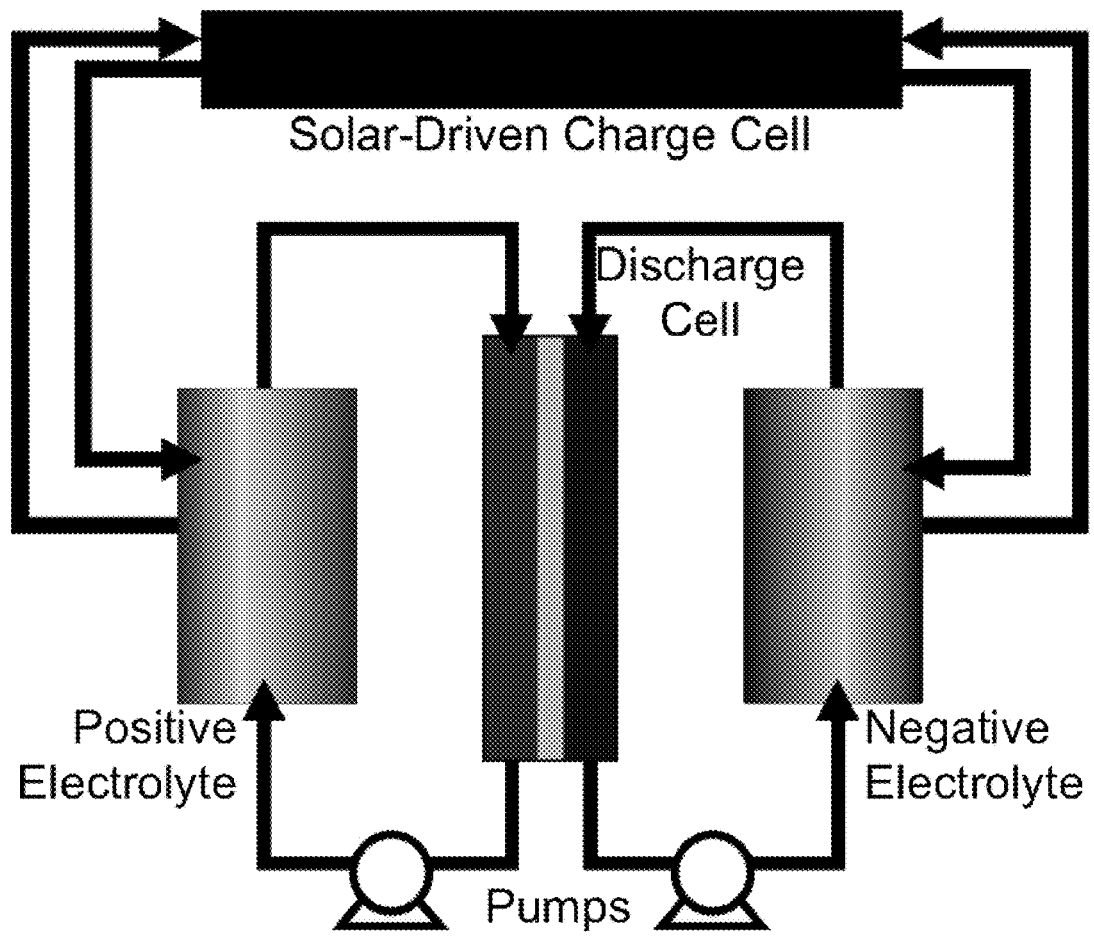
FIGS. 3A, 3B. General schematic of a solar flow battery having a full cell solar-driven photoelectrode, as charging cell, electrically interconnected with a full cell conventional electrode system functioning as a discharge cell (FIG. 3A), and a more specific three-dimensional view provided in FIG. 3B.
Figure 3B:
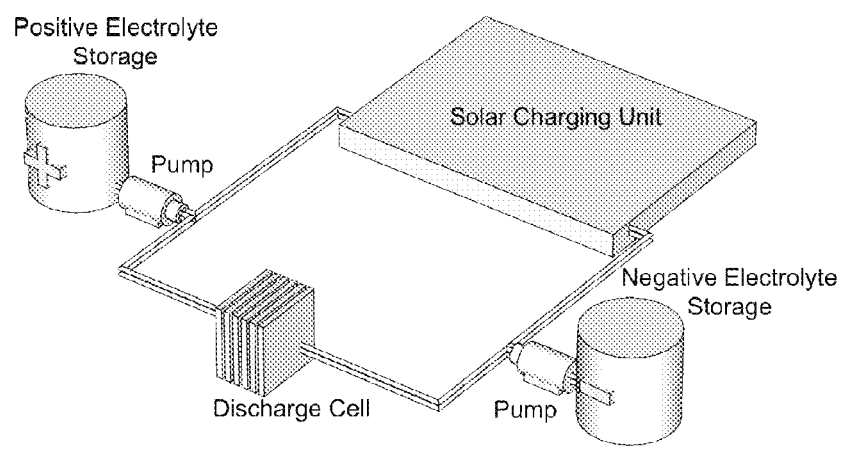

FIGS. 3A and 3B are schematic depictions of a solar flow battery having a full cell solar-driven photoelectrode (photovoltaic component), as charging cell, electrically interconnected with a full cell conventional electrode system functioning as a discharge cell. In the embodiment shown in FIG. 3A, the component identified as a solar-driven charge cell is a photoelectrochemical cell that contains a semiconductor light absorber, i.e., photoelectrode (in solid black, top) having a positive (anodic) portion and a negative (cathodic) portion, wherein the positive portion of the photoelectrode is in contact with the positive electrolyte and the negative portion is in contact with the negative electrolyte. Alternatively, the photoelectrode shown in FIG. 3A may be two or more photoelectrodes, wherein one or more function as a positive photoelectrode and one or more function as a negative photoelectrode. FIG. 3B is a more specific three-dimensional version of the SFB embodiment shown in FIG. 3A, with the photoelectrode encompassed by the "solar charging unit" and the positive and negative electrodes encompassed by the "discharge cell". In the charging process, the photoelectrode is exposed to a source of photons sufficient to induce an oxidation reaction of the first redox active molecule in the positive electrolyte at the positive side of the photoelectrode and sufficient to induce a reduction reaction of the second redox active molecule in the negative electrolyte at the negative side of the photoelectrode to produce, respectively, an oxidized version of the first redox active molecule and a reduced version of the second redox active molecule. Separating means are included for keeping the two redox reactions occurring at the photoelectrode separate, e.g., by inclusion of a separator component, or by means of a divergent flow pattern. By suitable means, the oxidized version of the first redox active molecule is directed to a conventional positive electrode in a positive compartment (shown at bottom, left), and the reduced version of the second redox active molecule is directed to a conventional negative electrode in a negative compartment (shown at bottom, right). In the discharging process, occurring at the discharge cell containing the two conventional electrodes, the oxidized version of the first redox active molecule undergoes reduction at the positive electrode to regenerate its original state while simultaneously accepting electrons from the positive electrode; and the reduced version of the second redox active molecule undergoes oxidation at the negative electrode to regenerate its original state while simultaneously providing electrons to the negative electrode. The combined electron transfer processes results in net electrical output. Generally, means are included for directing the regenerated first and second redox active molecules, produced at the positive and negative electrodes during discharge, back to the anodic and cathodic portions of the photoelectrode component, respectively, so that the SFB can be re-charged.

Examples have been set forth below for the purpose of illustration and to describe the best mode of the invention at the present time. However, the scope of this invention is not to be in any way limited by the examples set forth herein.

EXAMPLES

Figures 4A, 4B:
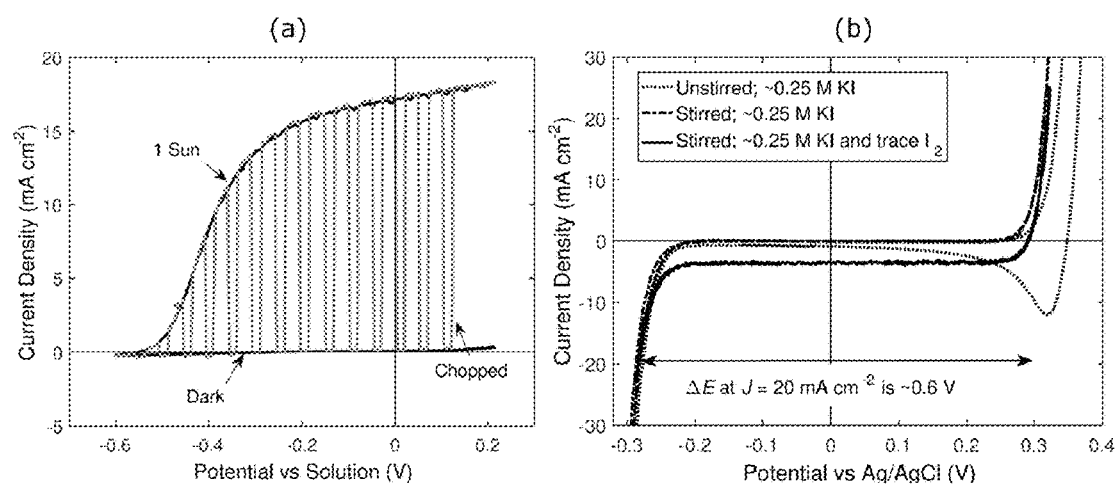
FIGS. 4A, 4B. Plots showing current-voltage behavior for an as-grown n-type $WSe_2$ photoelectrode (FIG. 4A), and a Pt-button electrode (FIG. 4B). Both datasets were collected in 0.5 M $H_2SO_4$ solution containing potassium iodide.
Figure 5:
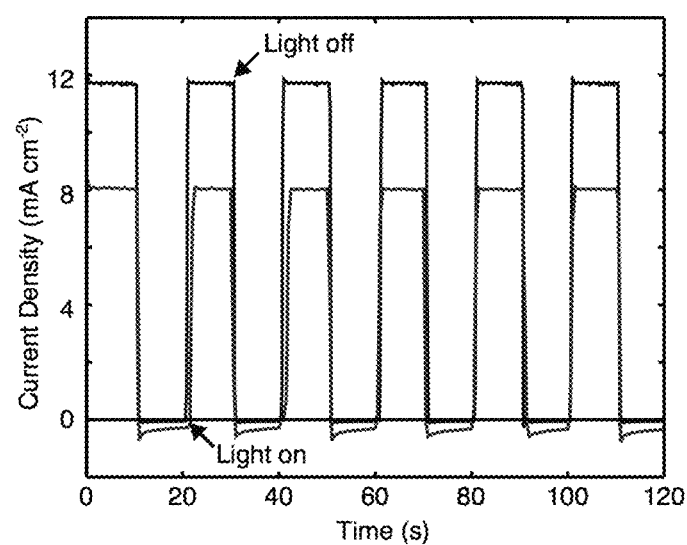
FIG. 5. Chopped-light experiment demonstrating current flow between a semiconductor absorber and a Pt counter electrode in the presence of HI electrolyte. The positive current values observed between the "light on" and "light off" time points indicates net electrolysis of HI to $H_2$ and $HI_3$.

In this experiment, the photoelectrochemistry of n-type $WSe_2$ semiconductor photoelectrodes in acidified polyhalide electrolytes was studied. Electrochemistry and photoelectrochemistry results for production of hydrogen and triiodide ($I_3^-$) from acidic iodide electrolyte are shown in FIGS. 4A and 4B. FIG. 5 shows current versus time data for a single n-type $WSe_2$ photoelectrode in contact with HI electrolyte and electrically connected to a Pt counter electrode and placed under intermittent illumination intended to approximate sunlight. These results indicate that n-type $WSe_2$ electrodes are capable of driving unassisted conversion of HI into $H_2$ and $HI_3$, corresponding to the RFB device design shown in FIG. 2A. Water soluble redox couples, such as sulfonated anthroquinones, can readily be used as alternatives to hydrogen evolution as a negative redox couple in such a system, thereby demonstrating that the SFB concept is flexible to production of fuel or non-fuel product species.

Figure 6:
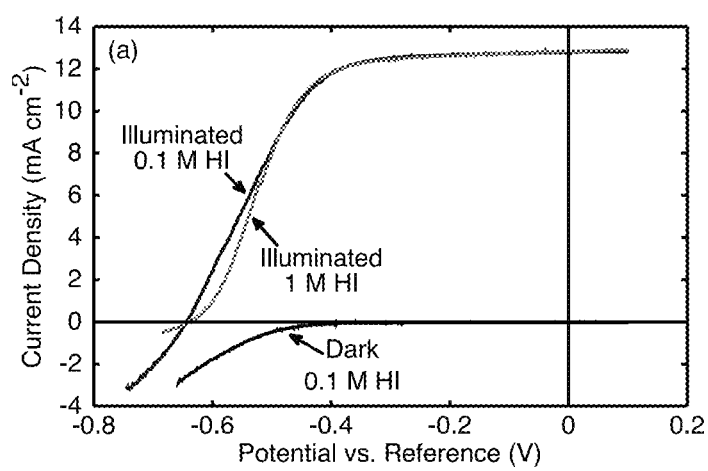
FIG. 6. Current-voltage behavior of a $WSe_2$ photoelectrode in contact with an acidic iodide electrolyte in two different concentrations, demonstrating the production of >0.6 V photovoltage and >10 mA $cm^{-2}$ photocurrent densities under solar-simulated illumination.
Figure 7:
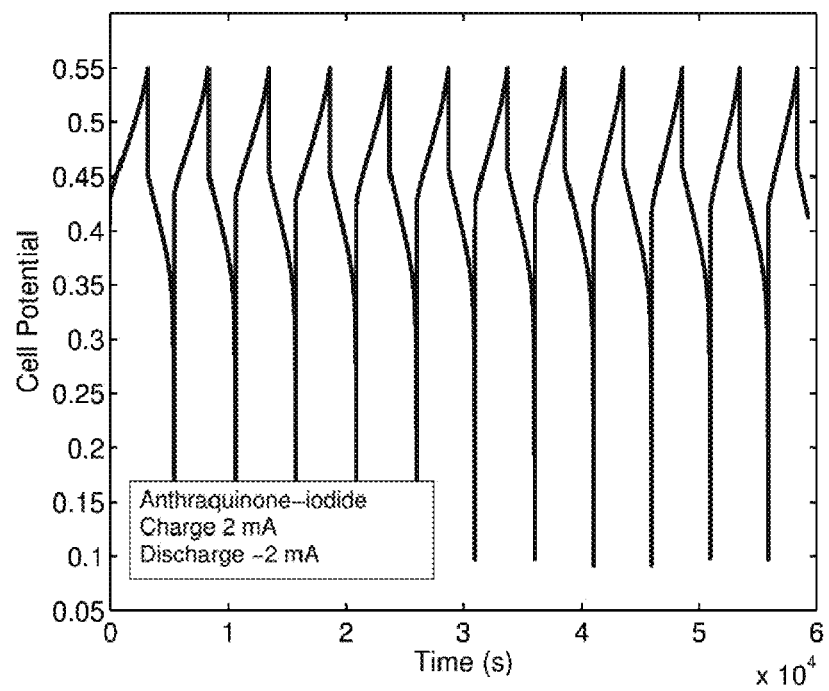
FIG. 7. Charge-discharge behavior of a RFB operated using an aqueous anthraquinone/dihydroanthraquinone sulfonate salt as the negative electrolyte and iodide/triiodide as the positive electrolyte.

FIG. 6 shows current-voltage data for a different n-$WSe_2$ photoelectrode in the presence of iodide electrolyte, and FIG. 7 shows charge-discharge behavior for an operational RFB system based on oxidation of iodide and reduction of anthraquinone monosulfonate. The voltage required to charge the RFB depicted in FIG. 7 is smaller than the photovoltage produced by the photoelectrode in a positive electrolyte of identical composition, attesting to the viability of a SFB system based on these components.

Figure 8:
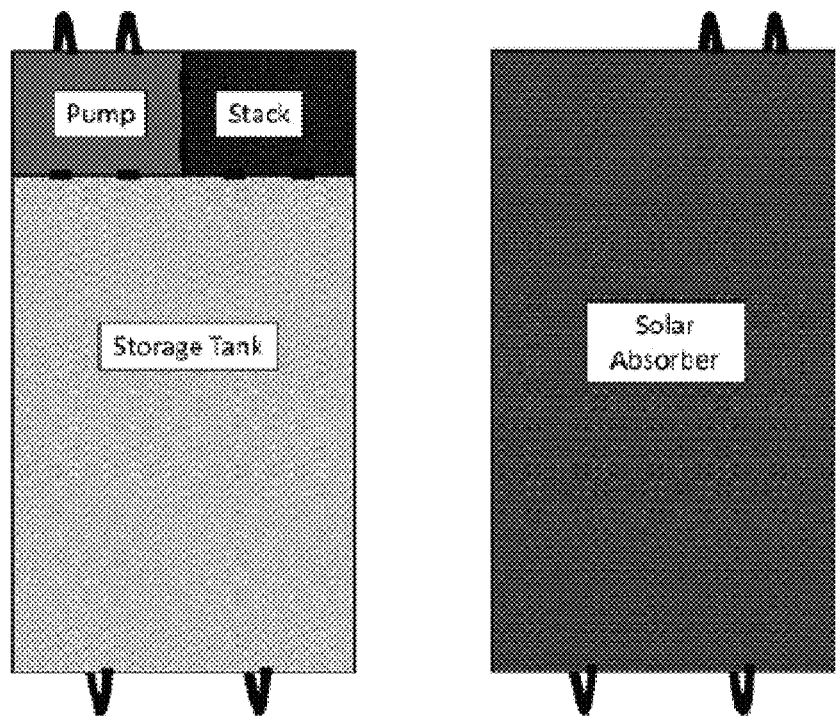
FIG. 8. Bottom (left) and top (right) views of a SFB panel device that integrates solar capture, storage, and cell discharge.
Figure 9:
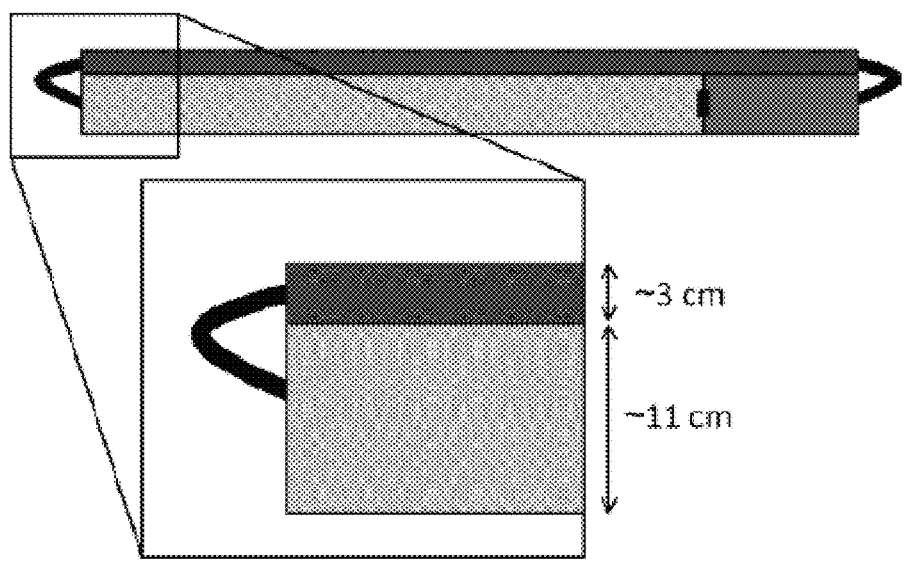
FIG. 9. Cross-section of the panel device in FIG. 5 showing the dimensions required to store up to two days of maximal solar energy input, typical for the central United States, using battery electrolytes with an energy density of ~25 Wh/L.

FIGS. 8 and 9 are schematic depictions of a complete SFB device intended to resemble a photovoltaic panel. The device includes a layer devoted to the light absorber(s) and flow channels for the solar driven-charge cycle of the SFB system. A second layer houses an electrolyte storage tank, pumps, and an integrated discharge cell. The dimensions noted in FIG. 8 correspond to those required to store up to two days of the maximum integrated solar energy flux available in the central United States, assuming an overall solar energy conversion efficiency of 15% from the photoelectrochemical cell and an electrolyte energy density comparable to that of a vanadium RFB. Notably, this efficiency is well within the range anticipated to be achievable from modeling studies, and the electrolyte energy density is already achievable using known redox chemistries.

An SFB device, such as that shown in FIGS. 8 and 9, would be able to deliver a constant DC electrical output corresponding to its average solar energy conversion rate over a given time span. Alternatively, the discharge stack could be omitted and the charged electrolyte could be removed and transported for storage in a larger external tank or use in an external RFB discharge cell.

Using models and experiments, it has herein been determined that solar flow batteries may be constructed from semiconductor absorbers and redox-active electrolytes. Devices of this type are useful for integrated solar energy capture and storage by providing a nominally continuous supply of electricity or charged electrolyte solution from otherwise intermittent solar energy.

The above results demonstrate the utility of a new type of solar energy conversion and storage device, herein referred to as a "solar flow battery". The salient characteristics of the invention are summarized below:

(1) The device may include a light absorber material that is capable of absorbing sunlight and converting the solar electromagnetic energy into electrochemical potential. Preferably, the absorber material is a semiconductor. More preferably, the absorber is a semiconductor that can form a rectifying contact with a suitable second material, such as another semiconductor, a metal, or an electrolyte. Even more preferably, the absorber forms a rectifying contact with an electrolyte without the need for solid-state junctions.

(2) The device may include more than one light absorber as in (1).

(3) The device may include one or more auxiliary electrodes electrically connected to the light absorber, such that the photovoltage generated by the light absorber will manifest as an electrical potential drop between the front surface of the absorber and the auxiliary electrode.

(4) The device may include a redox-active electrolyte. This electrolyte may consist of an aqueous or non-aqueous solution or colloid containing chemical species that are capable of undergoing electrochemical redox reactions. Examples of redox-active electrolytes include, but are not limited to, solutions of organic and inorganic transition metal complexes, halogens, halides, chalcogenides, and redox-active organic molecules. Preferably, the electrolyte also includes chemical constituents that are dissolved and dissociated as ions, but those ions do not undergo redox reactions during operation of the device. The device may also include more than one of the redox-active electrolytes.

(5) The device may include a mode of encapsulation such that the electrolyte can flow over the surface of the absorber as the absorber is simultaneously illuminated, while the entire assembly is isolated from the ambient environment. Preferably, the encapsulation material(s) are chemically resistant to degradation when in contact with the electrolyte. Also, preferably at least one of the encapsulation materials is substantially transparent to solar photons. Viable encapsulation materials include, but are not limited to, metals, ceramics, glasses, glues, epoxies, and polymers.

(6) The light absorber, electrolyte, and encapsulation may work together to facilitate net storage of solar energy through solar-driven electrochemical redox reactions. These reactions can be called "charging" reactions, and may take place at or near the surface of the semiconductor absorber(s) and/or auxiliary electrode(s).

(7) The light absorber in and/or the auxiliary electrode may be coated or coupled to an electrocatalyst material, which facilitates charge transfer between the absorber and the electrolyte so as to minimize energy losses. Preferably, this electrocatalyst material is substantially transparent to sunlight. Examples of electrocatalyst materials include, but are not limited to, precious metals (e.g., Pt, Pd, Au, Rh, and Ir), transition metals, and transition metal sulfides, nitrides, phosphides, carbides, and the like.

(8) The device may include integrated components for storage and pumping of the electrolyte between discrete locations or chambers.

(9) The device may also include integrated components for recovering the stored energy from the electrolyte via electrochemical redox reactions, which can be called "discharge" reactions. These components may reside substantially in the same location or chamber as the absorber materials, or in discrete locations or chambers.

(10) The device may include mechanisms for separating two types of compartments, designated positive compartments and negative compartments. The semiconductor light absorber(s), auxiliary electrodes, and the discharge components may be incorporated into either or both of these types of compartments.

(11) The separator mechanism preferably consists of one or more components that allow charged species to pass from the negative compartment to the positive compartment or vice-versa. More preferably, the separator mechanism does not allow the redox-active electrolyte(s) to pass between the compartments, but allows other charged species to pass between the compartments. The separator mechanism may consist of porous polymers or ceramic materials. Examples include, but are not limited to, polyethylene, polypropylene, polytetrafluoroethylene, alumina, silica, titania, zirconia, and the like. The separator mechanism may alternatively be facilitated by a cell geometry and/or flow system that minimizes mixing of the redox-active materials while permitting or facilitating charge transport between the compartments.

While there have been shown and described what are at present considered the preferred embodiments of the invention, those skilled in the art may make various changes and modifications which remain within the scope of the invention defined by the appended claims.

What is claimed is:

1. A solar flow battery comprising:
   a positive compartment containing at least one positive electrode in contact with a positive electrolyte solution comprised of a first redox active molecule dissolved in a solvent, wherein said first redox active molecule has a characteristic of remaining dissolved in solution when changed in oxidation state;
   a negative compartment containing at least one negative electrode in contact with a negative electrolyte solution comprised of a second redox active molecule dissolved in a solvent, wherein said second redox active molecule has a characteristic of remaining dissolved in solution when changed in oxidation state;
   wherein at least one of said negative or positive electrodes is a photoelectrode comprising a semiconductor light absorbing material able to conduct electrons and convert light energy into potential energy;
   electrical communication means for establishing electrical communication between said positive electrode, said negative electrode, and an external load for directing electrical energy into or out of said solar flow battery;
   a separator component that separates the positive electrolyte solution from the negative electrolyte solution and substantially prevents first and second redox active molecules from intermingling while permitting the passage of non-redox-active species between positive and negative electrolyte solutions; and
   at least two flow devices capable of establishing flow of the positive and negative electrolyte solutions past said positive and negative electrodes, respectively.

2. The solar flow battery of claim 1, wherein the positive and negative redox active molecules are different.

3. The solar flow battery of claim 1, wherein the positive and negative redox active molecules are the same.

4. The solar flow battery of claim 1, wherein one or both of said positive or negative electrolytes further comprises a supporting electrolyte.

5. The solar flow battery of claim 1, wherein said solvent is aqueous-based.

6. The solar flow battery of claim 1, wherein said solvent is an organic solvent.

7. The solar flow battery of claim 1, wherein said first or second redox active molecule contains a metal.

8. The solar flow battery of claim 7, wherein the metal contained in said redox active metal molecule is selected from the group consisting of Li, Na, K, Mg, Ca, Ti, V, Cr, Mn, Fe, Co, Ni Cu, Zn, La, Ce, Np, and U.

9. The solar flow battery of claim 7, wherein said first or second redox active molecule is an inorganic metal compound.

10. The solar flow battery of claim 9, wherein said inorganic metal compound is an inorganic metal halide compound.

11. The solar flow battery of claim 7, wherein said first or second redox active molecule is an organometallic compound.

12. The solar flow battery of claim 1, wherein said first or second redox active molecule is a hydrogen halide of the formula HX, wherein X is selected from Cl, Br, and I.

13. The solar flow battery of claim 1, wherein said first or second redox active molecule is a redox active organic molecule.

14. The solar flow battery of claim 13, wherein said redox active organic molecule contains a quinone functional group.

15. The solar flow battery of claim 14, wherein said redox active organic molecule contains an anthraquinone functional group.

16. The solar flow battery of claim 1, wherein one or both of said negative or positive compartments contains at least two electrodes, and at least one of said electrodes is a semiconductor solar absorber.

17. The solar flow battery of claim 16, further comprising first and second positive compartments in flowable exchange with each other, and first and second negative compartments in flowable exchange with each other, wherein the first positive compartment and first negative compartment contain, respectively, a first positive electrolyte in contact with a positive semiconductor solar absorber and a first negative electrolyte in contact with a negative semiconductor solar absorber; and said second positive compartment and second negative compartment contain, respectively, a second positive electrolyte in contact with said positive electrode and a second negative electrolyte in contact with said negative electrode.

18. The solar flow battery of claim 1, further comprising one or more electrolyte storage tanks with conduit means connected to said positive and negative compartments.

19. The solar flow battery of claim 1, wherein said semiconductor light absorber electrode is selected from the group consisting of Si, $SiO_2$, Ti, $TiO_2$, Ge, GaN, GaAs, InP, GaP, $MoS_2$, $MoSe_2$, $WS_2$, $WSe_2$, $Cu(In,Ga)(S,Se)_2$, $Cu_2ZnSn(S,Se)_4$, CdS, CdSe, and CdTe, and mixtures thereof.

20. The solar flow battery of claim 1, wherein said positive and negative electrodes are comprised of an element selected from the group consisting of C, Si, Ga, In, Al, Ti, V, Cr, Fe, Co, Ni, Cu, Zr, Nb, Ta, Mo, W, Re, Ru, Os, Rh, Jr, Pd, Pt, Ag, Au, alloys thereof, degenerately-doped semiconductors thereof, and oxides thereof.

21. A method for storing and releasing electrical energy, the method comprising electrically charging a solar flow battery followed by electrically discharging said solar flow battery, wherein said solar flow battery comprises:
a positive compartment containing at least one positive electrode in contact with a positive electrolyte solution comprised of a first redox active molecule dissolved in a solvent, wherein said first redox active molecule has a characteristic of remaining dissolved in solution when changed in oxidation state;
a negative compartment containing at least one negative electrode in contact with a negative electrolyte solution comprised of a second redox active molecule dissolved in a solvent, wherein said second redox active molecule has a characteristic of remaining dissolved in solution when changed in oxidation state;
wherein at least one of said negative or positive electrodes comprises a semiconductor light absorber;
electrical communication means for establishing electrical communication between said positive electrode, said negative electrode, and an external load for directing electrical energy into or out of said solar flow battery;
a separator component that separates the positive electrolyte solution from the negative electrolyte solution and substantially prevents first and second redox active molecules from intermingling while permitting the passage of non-redox-active species between positive and negative electrolyte solutions; and
at least two flow devices that establish flow of the positive and negative electrolyte solutions past said positive and negative electrodes, respectively;
charging said solar flow battery by exposing the semiconductor light absorber to solar irradiation while said external load is not in electrical communication with said positive and negative electrodes, to result in oxidation of the first redox active molecule in the positive electrolyte and reduction of the second redox active molecule in the negative electrolyte, to produce, respectively, an oxidized version of the first redox active molecule in the positive electrolyte and a reduced version of the second redox active molecule in the negative electrolyte; and
discharging said solar flow battery by establishing electrical communication of said external load with said positive and negative electrodes, to result in net electrical power output dissipated at the external load with concomitant reversal of redox reactions in the positive and negative electrolytes.

22. The method of claim 21, wherein the positive and negative redox active molecules are different.

23. The method of claim 21, wherein the positive and negative redox active molecules are the same.

24. The method of claim 21, wherein one or both of said positive or negative electrolytes further comprises a supporting electrolyte.

25. The method of claim 21, wherein said solvent is aqueous-based.

26. The method of claim 21, wherein said solvent is an organic solvent.

27. The method of claim 21, wherein said first or second redox active molecule contains a metal.

28. The method of claim 27, wherein the metal contained in said redox active molecule is selected from Li, Na, K, Mg, Ca, Ti, V, Cr, Mn, Fe, Co, Ni Cu, Zn, La, Ce, Np, and U.

29. The method of claim 27, wherein said first or second redox active molecule is an inorganic metal compound.

30. The method of claim 29, wherein said inorganic metal compound is an inorganic metal halide compound.

31. The method of claim 27, wherein said first or second redox active molecule is an organometallic compound.

32. The method of claim 21, wherein said first or second redox active molecule is a hydrogen halide of the formula HX, wherein X is selected from Cl, Br, and I.

33. The method of claim 21, wherein said first or second redox active molecule is a redox active organic molecule.

34. The method of claim 33, wherein said redox active organic molecule contains a quinone functional group.

35. The method of claim 34, wherein said redox active organic molecule contains an anthraquinone functional group.

36. The method of claim 21, wherein one or both of said negative or positive compartments contains at least two electrodes, and at least one of said electrodes is a semiconductor solar absorber.

37. The method of claim 36, further comprising first and second positive compartments in flowable exchange with each other, and first and second negative compartments in flowable exchange with each other, wherein the first positive compartment and first negative compartment contain, respectively, a first positive electrolyte in contact with a positive semiconductor solar absorber and a first negative electrolyte in contact with a negative semiconductor solar absorber; and said second positive compartment and second negative compartment contain, respectively, a second positive electrolyte in contact with said positive electrode and a second negative electrolyte in contact with said negative electrode.

38. The method of claim 21, further comprising one or more electrolyte storage tanks with conduit means connected to said positive and negative compartments.

39. The method of claim 21, wherein said semiconductor light absorber electrode is selected from the group consisting of Si, $SiO_2$, Ti, $TiO_2$, Ge, GaN, GaAs, InP, GaP, $MoS_2$, $MoSe_2$, $WS_2$, $WSe_2$, $Cu(In,Ga)(S,Se)_2$, $Cu_2ZnSn(S,Se)_4$, CdS, CdSe, and CdTe, and mixtures thereof.

40. The method of claim 21, wherein said positive and negative electrodes are comprised of an element selected from the group consisting of C, Si, Ga, In, Al, Ti, V, Cr, Fe, Co, Ni, Cu, Zr, Nb, Ta, Mo, W, Re, Ru, Os, Rh, Ir, Pd, Pt, Ag, Au, alloys thereof, degenerately-doped semiconductors thereof, and oxides thereof.

41. The solar flow battery of claim 1, wherein said light absorbing material is selected from the group consisting of $MoS_2$, $MoSe_2$, $WS_2$, $WSe_2$, $Cu_2ZnSn(S,Se)_4$, CdS, and CdSe, and mixtures thereof.

42. The solar flow battery of claim 1, wherein said light absorbing material is selected from the group consisting of $MoS_2$, $MoSe_2$, $WS_2$, and $WSe_2$, and mixtures thereof.

43. The solar flow battery of claim 1, wherein said light absorbing material forms a rectifying contact with said positive or negative electrolyte solution without the need for solid-state junctions in the photoelectrode.

44. The solar flow battery of claim 1, wherein said at least two flow devices are selected from pump, propeller, gravity driven pumping arrangement, and combinations thereof.

* * * * *